United States Patent  
Fukuoka et al.

(10) Patent No.: US 6,713,192 B2
(45) Date of Patent: Mar. 30, 2004

(54) ORGANIC ELECTROLUMINESCENCE DEVICE AND ORGANIC LIGHT EMITTING MEDIUM

(75) Inventors: Kenichi Fukuoka, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 09/819,663

(22) Filed: Mar. 29, 2001

(65) Prior Publication Data

US 2002/0048688 A1 Apr. 25, 2002

(30) Foreign Application Priority Data

Mar. 30, 2000 (JP) ........................................ 2000/093976

(51) Int. Cl.$^7$ .............................................. H05B 33/12
(52) U.S. Cl. ...................... 428/690; 428/917; 313/504; 313/506
(58) Field of Search ................................ 428/690, 917; 313/502, 503, 506, 504

(56) References Cited

U.S. PATENT DOCUMENTS

| 4,769,292 | A |   | 9/1988  | Tang et al. ............... 428/690 |
| 5,635,308 | A |   | 6/1997  | Inoue et al. .............. 428/696 |
| 5,776,622 | A | * | 7/1998  | Hung et al. .............. 428/690 |
| 5,972,247 | A |   | 10/1999 | Shi et al. ................. 252/583 |
| 6,013,384 | A | * | 1/2000  | Kido et al. ............... 428/690 |
| 6,074,734 | A | * | 6/2000  | Kawamura et al. ...... 428/220 |
| 6,093,864 | A | * | 7/2000  | Tokailin et al. .......... 585/25 |
| 6,203,933 | B1|   | 3/2001  | Nakaya et al. ........... 428/690 |
| 6,224,966 | B1| * | 5/2001  | Sakai et al. .............. 428/212 |
| 6,361,886 | B2| * | 3/2002  | Shi et al. ................. 428/690 |
| 6,387,546 | B1| * | 5/2002  | Hamada et al. .......... 428/690 |
| 2002/0048687 | A1| * | 4/2002 | Hosokawa et al. ...... 482/690 |

FOREIGN PATENT DOCUMENTS

| EP | 0 961 330   |   | 12/1999 |
| JP | 08-012600   | * | 1/1996  |
| JP | 8 311442    |   | 11/1996 |
| JP | 10-294179   | * | 11/1998 |
| JP | 11-003782   |   | 1/1999  |
| JP | 11-111458   |   | 4/1999  |
| JP | 11-111460   |   | 4/1999  |
| JP | 11-228951   | * | 8/1999  |
| JP | 11-273861   |   | 10/1999 |
| JP | 11-323323   |   | 11/1999 |
| JP | 11-354283   |   | 12/1999 |
| JP | 2000-007604 |   | 1/2000  |

* cited by examiner

Primary Examiner—Cynthia H. Kelly
Assistant Examiner—Dawn Garrett
(74) Attorney, Agent, or Firm—Oblon, Spivak, McClelland, Maier & Neustadt, P.C.

(57) ABSTRACT

An electroluminescence device comprising a pair of electrodes and a layer of an organic light emitting medium disposed between the pair of electrodes, wherein the layer of an organic light emitting medium comprises (A) at least one electron transporting compound and (B) an anthracene derivative having a specific structure and an organic light emitting medium comprising the above components (A) and (B). The device exhibits excellent heat resistance, has a long life time and provides efficient light emission. The organic light emitting medium is advantageously used for the organic EL device

13 Claims, No Drawings

ORGANIC ELECTROLUMINESCENCE DEVICE AND ORGANIC LIGHT EMITTING MEDIUM

TECHNICAL FIELD

The present invention relates to an organic electroluminescence (electroluminescence will be referred to as EL, hereinafter) device and an organic light emitting medium and, more particularly, to an organic EL device which exhibits excellent heat resistance, has a long life time and provides efficient light emission and an organic light emitting medium which is advantageously used for the organic EL device.

BACKGROUND ART

EL devices which utilize EL show high self-distinguishability because of the self-emission and are excellent in impact resistance because they are completely solid devices. Therefore, EL devices have been attracting attention for application as light emitting devices in various types of display apparatus.

The EL devices include inorganic EL devices in which an inorganic compound is used as the light emitting material and organic EL devices in which an organic compound is used as the light emitting material. Organic EL devices have been extensively studied for practical application as a light emitting device of the next generation because the applied voltage can be decreased to a great extent, the size of the device can be reduced easily, consumption of electric power is small, planar light emission is possible and three primary colors are easily emitted.

As for the construction of the organic EL device, the basic construction comprises an anode/an organic light emitting layer/a cathode. Constructions having a hole injecting and transporting layer or an electron injecting layer suitably added to the basic construction are known. Examples of such construction include the construction of an anode/a hole injecting and transporting layer/an organic light emitting layer/a cathode and the construction of an anode/a hole injecting and transporting layer/an organic light emitting layer/an electron injecting layer/a cathode.

In practical application of organic EL devices, driving stability and storage stability in environments at high temperatures such as outdoors and in automobiles are required. When an EL device is used outdoors or for an instrument used in an automobile, in general, storage stability at a high temperature of 75° C. is required. However, when a conventional organic EL device is stored at a high temperature of about 75° C., problems arise in that color of emitted light changes and the efficiency of light emission decreases. These problems inevitably restrict application of the organic EL devices.

Various attempts have been made to obtain a device which exhibits excellent heat resistance, has a long life time, achieves a high efficiency and emits bluish light. However, it is the actual present situation that no devices having satisfactory properties are obtained.

For example, a technology in which a single monoanthracene compound is used as the organic light emitting material has been disclosed in Japanese Patent Application Laid-Open No. Heisei 11(1999)-3782. However, in accordance with this technology, for example, the luminance obtained under a current density of 165 mA/cm² is as small as 1650 cd/m² and the efficiency is as small as 1 cd/A.

Therefore, the technology is not practically useful. Another technology in which a single bisanthracene compound is used as the organic light emitting material has been disclosed in Japanese Patent Application Laid-Open No. Heisei 8(1996)-12600. However, in accordance with this technology, the efficiency is as small as 1 to 3 cd/A and further improvement is desired for practical use. An organic EL device having a long life time in which a distyryl compound is used as the organic light emitting material and styrylamine is additionally used has been disclosed in International Patent Application Laid-Open No. 94-6157. However, this device has a half-life time of about 1000 hours and further improvement is desired.

DISCLOSURE OF THE INVENTION

Under the above circumstances, the present invention has an object of providing an organic EL device which exhibits excellent heat resistance, has a long life time and provides efficient light emission and an organic light emitting medium advantageously used for the organic EL device.

As the result of extensive studies by the present inventors to achieve the above object, it was found that an organic EL device in which the organic light emitting medium comprises a combination of an electron transporting material and a specific anthracene derivative and a layer comprising the organic light emitting medium is disposed between a pair of electrodes exhibited excellent heat resistance, had a long life time and provided efficient blue light emission. The present invention has been completed based on the knowledge.

The present invention can be summarized as follows.

[1] An organic electroluminescence device which comprises a pair of electrodes and a layer of an organic light emitting medium disposed between the pair of electrodes, wherein the layer of an organic light emitting medium comprises (A) at least one electron transporting compound and (B) at least one compound selected from anthracene derivatives represented by general formula (1):

$$A^1-L-A^2 \qquad (I)$$

wherein $A^1$ and $A^2$ each represent a substituted or unsubstituted monophenylanthryl group or a substituted or unsubstituted diphenylanthryl group and may represent a same group or different groups and L represents a single bond or a divalent connecting group; and anthracene derivatives represented by general formula (II):

$$A^3-An-A^4 \qquad (II)$$

wherein An represents a substituted or unsubstituted divalent anthracene residue group and $A^3$ and $A^4$ each represent a substituted or unsubstituted monovalent condensed aromatic ring group having 10 or more carbon atoms or a substituted or unsubstituted non-condensed ring aryl group having 12 or more carbon atoms and may represent a same group or different groups.

[2] An organic electroluminescence device described in [1], wherein the anthracene derivative represented by general formula (I) is an anthracene derivative represented by general formula (I-a):

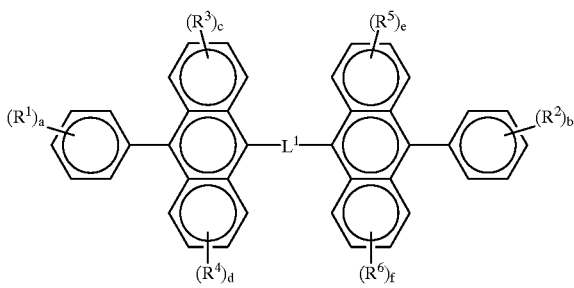

(I-a)

wherein $R^1$ to $R^6$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; a and b each represent an integer of 0 to 5; c, d, e and f each represent an integer of 0 to 4; when any of a to f represents an integer of 2 or greater, a plurality of groups represented by corresponding $R^1$, $R^2$, $R^3$, $R^4$, $R^5$ or $R^6$ may be the same with or different from each other and may form a ring by forming a bond between each other; and $L^1$ represents a single bond, —O—, —S—, —N(R)— or an arylene group, R representing an alkyl group or a substituted or unsubstituted aryl group; or an anthracene derivative represented by general formula (I-b):

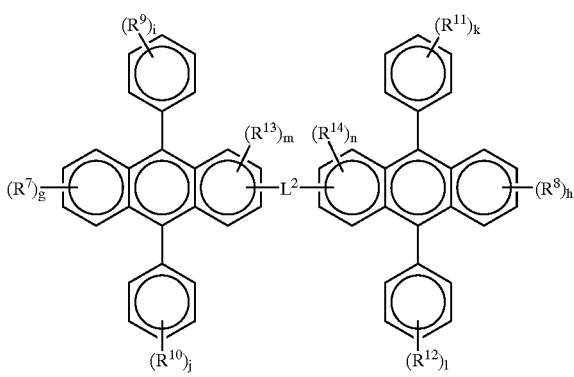

(I-b)

wherein $R^7$ to $R^{14}$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; g and h each represent an integer of 0 to 4; i, j, k and l each represent an integer of 0 to 5; m and n each represent an integer of 0 to 3; when any of g to l represents an integer of 2 or greater, a plurality of groups represented by corresponding $R^7$, $R^8$, $R^9$, $R^{10}$, $R^{11}$ or $R^{12}$ may be the same with or different from each other and may form a ring by forming a bond between each other; and $L^2$ represents a single bond, —O—, —S—, —N(R)— or an arylene group, R representing an alkyl group or a substituted or unsubstituted aryl group.

[3] An organic electroluminescence device described in any of [1] and [2], wherein the anthracene derivative represented by general formula (II) of component (B) is an anthracene derivative represented by general formula (II-a):

$$Ar^1—An—Ar^2 \qquad (II-a)$$

wherein An represents a substituted or unsubstituted divalent anthracene residue group and $Ar^1$ and $Ar^2$ each independently represent a monovalent residue group derived from fluoranthene, naphthalene, phenanthrene, anthracene, pyrene, perylene, coronene, chrysene, picene, fluorene, terphenyl, diphenylanthracene, biphenyl, an N-alkylcarbazole, an N-arylcarbazole, triphenylene, rubicene, benzoanthracene or dibenzoanthracene, which may be substituted or unsubstituted, or a group represented by general formula (II-x):

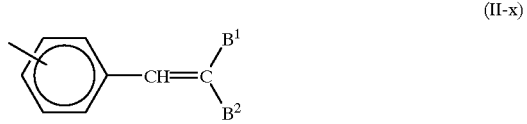

(II-x)

wherein $B^1$ and $B^2$ each represent a substituted or unsubstituted phenyl group, naphthyl group, biphenyl group, terphenyl group or anthryl group.

[4] An organic electroluminescence device described in any of [1] to [3], wherein the electron transporting compound of component (A) is a metal complex comprising a ligand having a nitrogen atom, a heterocyclic compound having a nitrogen atom or a ring compound having Si.

[5] An organic electroluminescence device described in any of [1] to [4], wherein the layer of an organic light emitting medium comprises component (A) and component (B) in amounts such that a ratio of an amount by mass of component (A) to an amount by mass of component (B) is in a range of 1:99 to 99:1.

[6] An organic electroluminescence device described in any of [1] to [5], wherein the layer of an organic light emitting medium comprises a fluorescent compound as component (C).

[7] An organic electroluminescence device described in [6], wherein the fluorescent compound of component (C) is a compound selected from styryl derivatives comprising amines which are represented by general formula (III):

(III)

wherein $Ar^3$, $Ar^4$ and $Ar^5$ each independently represent a substituted or unsubstituted monovalent aromatic group having 6 to 40 carbon atoms, at least one of the groups represented by $Ar^3$, $Ar^4$ and $Ar^5$ comprises a substituted or unsubstituted styryl group and p represents an integer of 1 to 4; styryl derivatives comprising amines which are represented by general formula (IV):

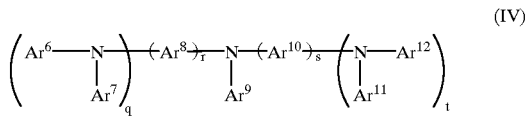

(IV)

wherein $Ar^6$, $Ar^7$, $Ar^9$, $Ar^{11}$ and $Ar^{12}$ each independently represent a substituted or unsubstituted monovalent aromatic group having 6 to 40 carbon atoms, $Ar^8$ and $Ar^{10}$ each independently represent a substituted or unsubstituted divalent aromatic group having 6 to 40 carbon atoms, at least one of the groups represented by $Ar^6$ to $Ar^{12}$ comprises a substituted or unsubstituted styryl group or a substituted or unsubstituted styrylene group, q and t each represent an integer of 0 to 2 and r and s each represent an integer of 1 or 2; and condensed polycyclic aromatic compounds.

[8] An organic electroluminescence device described in any of [6] and [7], wherein the layer of an organic light emitting medium comprises component (A), component (B) and component (C) in amounts such that a ratio of a total amount by mass of component (A) and component (B) to an amount by mass of component (C) is in a range of 100:1 to 1:10.

[9] An organic electroluminescence device described in any of [1] to [8], comprises a layer of a chalcogenide, a layer of a metal halide or a layer of a metal oxide, which is disposed on a surface of at least one of the pair of electrodes.

[10] An organic electroluminescence device described in any of [1] to [9], which comprises a mixed region of a reducing dopant and an organic substance or a mixed region of an oxidizing dopant and an organic substance, which is disposed on a surface of at least one of the pair of electrodes.

[11] An organic electroluminescence device described in any of [1] to [10], wherein the layer of an organic light emitting medium has a thickness in a range of 10 to 400 nm.

[12] An organic light emitting medium which comprises (A) an electron transporting compound and (B) at least one compound selected from anthracene derivatives represented by general formulae (I) and (II) described in [1].

[13] An organic light emitting medium described in [12], which comprises a fluorescent compound as component (C).

THE MOST PREFERRED EMBODIMENT TO CARRY OUT THE INVENTION

The organic EL device of the present invention has a structure comprising a pair of electrodes and a layer of an organic light emitting medium disposed between the pair of electrodes.

In the present invention, a layer comprising a combination of (A) an electron transporting compound and (B) an anthracene derivative having a specific structure or a combination of component (A), component (B) and (C) a fluorescent compound is used as the above layer of a light emitting medium The electron transporting compound of component (A) is not particularly limited as long as the compound has the electron transporting property. Preferable examples of the compound include metal complexes comprising a ligand having a nitrogen atom, heterocyclic compounds having a nitrogen atom and ring compounds having Si.

Examples of the metal complex comprising a ligand having a nitrogen atom as component (A) include compounds represented by the following general formula:

wherein M represents a monovalent, divalent or trivalent metal, X represents a ligand having a nitrogen atom, Y represents a ligand having no nitrogen atoms, m represents a number of 1, 2 or 3, n represents a number of 0, 1 or 2 and m+n≦3.

Examples of the metal represented by M include Li, Na, Cs, Be, Mg, Ca, Ba, Zn, Cd, Al, Ga, In and Yb. Among these metals, Al, Be and Ga are preferable.

Examples of the ligand having a nitrogen atom include quinolinol ligands and benzoquinolinol ligands. Examples of the quinolinol ligand include quinolinol ligands represented by the following general formula:

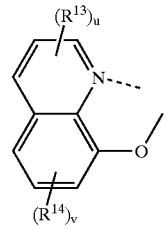

wherein $R^{13}$ and $R^{14}$ each represent a halogen atom or a substituted or unsubstituted group selected from alkyl groups, cycloalkyl groups, aryl groups, heteroaryl groups, alkenyl groups, alkanoyl groups, cycloalkanoyl groups, aryloyl groups and heteroaryl groups having at least one of a nitrogen atom, an oxygen atom and a sulfur atom as the heteroatom, u and v each represent an integer of 0 to 3 and, when any of u and v represents an integer or 2 or greater, a plurality of groups represented by corresponding $R^{13}$ or $R^{14}$ may form a ring by forming a bond between each other.

The ligand having no nitrogen atoms in the above formula is not particularly limited. Ligands having an oxygen atom derived from phenol, naphthol or a derivative of phenol or naphthol substituted with an alkyl group or an aryl group are preferable.

Examples of the metal complexes having a ligand having a nitrogen atom include metal complexes having a ligand derived from 8-quinolinol or derivatives thereof such as tris(8-quinolinolato)aluminum, bis(8-quinolinolato)magnesium, bis(benzo[f]-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-methyl-8-quinolinolato)gallium, bis(5-chloro-8-quinolinolato)calcium, 5,7-dichloro-8-quinolinolatoaluminum, tris(5,7-dibromo-8-hydroxyquinolinolato)-aluminum and poly[zinc (II)-bis(8-hydroxy-5-quinolinyl)methane].

Examples of aluminum complex comprising a ligand having a nitrogen atom and a ligand having no nitrogen atoms include bis(2-methyl-8-quinolinolato)(phenolato)aluminum(III), bis(2-methyl-8-quinolinolato)(ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)(ortho-phenylphenolato)aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2, 3-dimethylphenolato)aluminum(III), bis(2-methyl-8-quinolinolato)(2,6-dimethylphenolato)aluminum(III), bis(2-methyl-8-quinolinolato)(3,4-dimethylphenolato)aluminum(III), bis(2-methyl-8-quinolinolato)(3, 5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato)aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6- tetramethylphenolato)aluminum(III), bis(2-methyl-8-quinolinolato)(1-naphtholato)aluminum(III), bis(2-methyl-8-quinolinolato)(2-naphtholato)aluminum(III), bis(2,4-dimethyl-8-quinolinolato)(ortho-phenylphenolato) aluminum(III), bis(2,4-dimethyl-8-quinolinolato)(para-phenylphenolato)aluminum(III), bis(2,4-dimethyl-8-quinolinolato)(meta-phenylphenolato)aluminum(III), bis(2,4-dimethyl-8-quinolinolato)(3,5-dimethylphenolato) aluminum(III), bis(2,4-dimethyl-8-quinolinolato)(3,5-di-tert-butylphenolato)aluminum(III), bis (2-methyl-4-ethyl-8-quinolinolato)(para-cresolato)aluminum(III), bis(2-methyl-4-methoxy-8-quinolinolato)(para-phenylphenolato) aluminum(III), bis(2-methyl-5-cyano-8-quinolinolato) (ortho-cresolato)aluminum(III) and bis(2-methyl-6-trifluoromethyl-8-quinolinolato)(2-naphtholato)aluminum (III).

Further examples of the above compound include bis(2-methyl-8-quinolinolato)aluminum(III)-$\mu$-oxo-bis(2-methyl-8-quinolinolato)-aluminum (III), bis(2,4-dimethyl-8-quinolinolato)aluminum(III)-$\mu$-oxo-bis(2,4-dimethyl-8-quinolinolato)aluminum(III), bis(4-ethyl-2-methyl-8-quinolinolato)aluminum(III)-$\mu$-oxo-bis(4-ethyl-2-methyl-8-quinolinolato)-aluminum(III), bis(2-methyl-4-mothoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III) and bis(2-methyl-5-trifluoromethyl-8-quinolinolato)aluminum(III)-$\mu$-oxo-bis (2-methyl-5-trifluoromethyl-8-quinolinolato)aluminum(III).

Examples of the heterocyclic compound having a nitrogen atom as component (A) include oxadiazole derivatives such as 2-(4-biphenylyl)-5-(4-tert-butylphenyl)-1,3,4-oxadiazole and bis[2-(4-tert-butylphenyl)-1,3,4-oxadiazole]-m-phenylene, triazole derivatives and quinoxaline quinoline derivatives.

Examples of the ring compound having Si as component (A) include silacyclopentadiene derivatives. In the present invention, metal complexes comprising a ligand having a nitrogen atom are preferable among these compounds.

In the present invention, the electron transporting compound of component (A) may be used singly or in combination of two or more.

The anthracene derivative of component (B) used in the layer of an organic light emitting medium is an anthracene derivative represented by general formula (I):

$$A^1-L-A^2 \quad (I)$$

wherein $A^1$ and $A^2$ each represent a substituted or unsubstituted monophenylanthryl group or a substituted or unsubstituted diphenylanthryl group and may represent the same group or different groups and L represents a single bond or a divalent connecting group; or an anthracene derivative represented by general formula (II):

$$A^3-An-A^4 \quad (II)$$

wherein An represents a substituted or unsubstituted divalent anthracene residue group and $A^3$ and $A^4$ each represent a substituted or unsubstituted monovalent condensed aromatic ring group having 10 or more carbon atoms or a substituted or unsubstituted non-condensed ring aryl group having 12 or more carbon atoms and may represent the same group or different groups.

When the groups in general formulae (I) and (II) have a substituent, examples of the substituent include alkyl groups having 1 to 6 carbon atoms, cycloalkyl groups having 3 to 6 carbon atoms, alkoxy groups having 1 to 6 carbon atoms, aryloxy groups having 5 to 18 carbon atoms, aralkyloxy groups having 7 to 18 carbon atoms, amino group substituted with an aryl group having 5 to 16 carbon atoms, nitro group, cyano group, ester groups having 1 to 6 carbon atoms and halogen atoms.

Examples of the alkyl group having 1 to 6 carbon atoms include methyl group, ethyl group, propyl group, isopropyl group, butyl group, isobutyl group, sec-butyl group, tert-butyl group, various types of pentyl groups and various types of hexyl groups. Examples of the alkoxy group having 1 to 6 carbon atoms include methoxy group, ethoxy group, propoxy group, isopropoxy group, butoxy group, isobutoxy group, sec-butoxy group, tert-butoxy group, various types of pentyloxy groups and various types of hexyloxy groups. Examples of the cycloalkyl group having 3 to 6 carbon atoms include cyclopropyl group, cyclobutyl group, cyclopentyl group and cyclohexyl group.

Examples of the aryloxy group having 5 to 18 carbon atoms include phenoxy group, tolyloxy group and naphthyloxy group. Examples of the aralkyloxy group having 7 to 18 carbon atoms include benzyloxy group, phenetyloxy group and naphthylmethoxy group. Examples of the amino group substituted with an aryl group having 5 to 16 carbon atoms include diphenylamino group, ditolylamino group, dinaphthylamino group and naphthylphenylamino group. Examples of the ester group having 1 to 6 carbon atoms include methoxycarbonyl group, ethoxycarbonyl group, propoxycarbonyl group and isopropoxycarbonyl group. Examples of the halogen atom include fluorine atom, chlorine atom and bromine atom. The aryl group in the present invention include styrylphenyl group, styrylbiphenyl group and styrylnaphthyl group.

Preferable examples of the anthracene derivative represented by general formula (I) include anthracene derivatives represented by general formula (I-a):

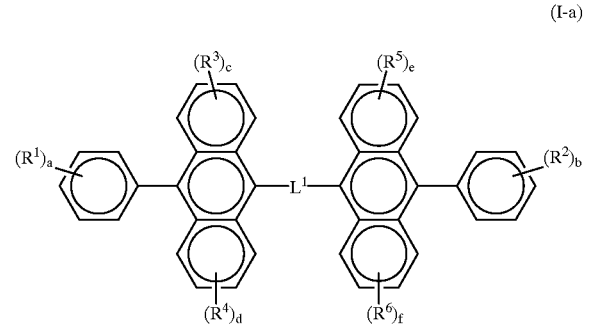

wherein $R^1$ to $R^6$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; a and b each represent an integer of 0 to 5; c, d, e and f each represent an integer of 0 to 4; when any of a to f represents an integer of 2 or greater, a plurality of groups represented by corresponding $R^1$, $R^2$, $R^3$, $R^4$, $R^5$ or $R^6$ may be the same with or different from each other and may form a ring by forming a bond between each other; and $L^1$ represents a single bond, —O—, —S—, —N(R)— or an arylene group, R representing an alkyl group or a substituted or unsubstituted aryl group; and anthracene derivatives represented by general formula (I-b):

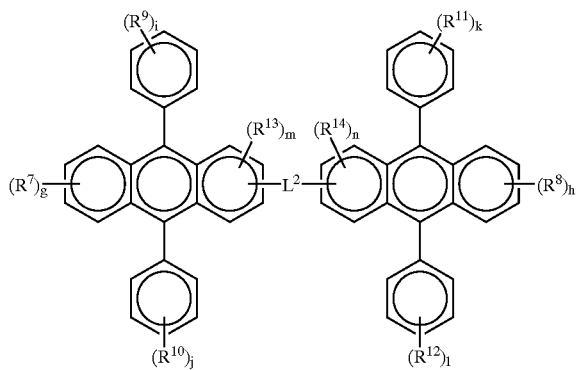

(I-b)

wherein $R^7$ to $R^{14}$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; g and h each represent an integer of 0 to 4; i, j, k and l each represent an integer of 0 to 5; m and n each represent an integer of 0 to 3; when any of g to l represents an integer of 2 or greater, a plurality of groups represented by corresponding $R^7$, $R^8$, $R^9$, $R^{10}$, $R^{11}$ or $R^{12}$ may be the same with or different from each other and may form a ring by forming a bond between each other; and $L^2$ represents a single bond, —O—, —S—, —N(R)— or an arylene group, R representing an alkyl group or a substituted or unsubstituted aryl group.

In the above general formulae (I-a) and (I-b), preferable examples of the alkyl group, the cycloalkyl group, the aryl group, the alkoxy group, the aryloxy group, the arylamino group and the heterocyclic group which are represented by $R^1$ to $R^{14}$ include alkyl groups having 1 to 6 carbon atoms, cycloalkyl groups having 3 to 6 carbon atoms, aryl groups having 5 to 18 carbon atoms, alkoxy groups having 1 to 6 carbon atoms, aryloxy groups having 5 to 18 carbon atoms, amino groups substituted with an aryl group having 5 to 16 carbon atoms and heterocyclic groups such as triazole group, oxadiazole group, quinoxaline group, furanyl group and thienyl group, respectively.

In the group represented by —N(R)— which is represented by $L^1$ or $L^2$, it is preferable that the alkyl group represented by R is an alkyl group having 1 to 6 carbon atoms and the aryl group represented by R is an aryl group having 5 to 18 carbon atoms.

Preferable examples of the anthracene derivative represented by general formula (II) include anthracene derivatives represented by general formula (II-a):

$$Ar^1—An—Ar^2 \quad \text{(II-a)}$$

wherein An represents a substituted or unsubstituted divalent anthracene residue group and $Ar^1$ and $Ar^2$ each independently represent a monovalent residue group derived from fluoranthene, naphthalene, phenanthrene, anthracene, pyrene, perylene, coronene, chrysene, picene, fluorene, terphenyl, diphenylanthracene, biphenyl, an N-alkylcarbazole, an N-arylcarbazole, triphenylene, rubicene, benzoanthracene or dibenzoanthracene, which may be substituted or unsubstituted, or a group represented by general formula (II-x):

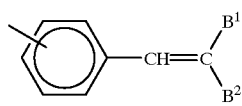

(II-x)

wherein $B^1$ and $B^2$ each represent a substituted or unsubstituted phenyl group, naphthyl group, biphenyl group, terphenyl group or anthryl group.

When the groups represented by An, $Ar^1$ and $Ar^2$ have substituents, examples of the substituent include the groups described as the examples of the substituents in general formulae (I) and (II).

In the present invention, the anthracene derivative of component (B) may be used singly or in combination of two or more.

Specific examples of the anthracene derivative represented by general formula (I-a) are shown in the following. In the formulae, Me represents methyl group (similarly, hereinafter).

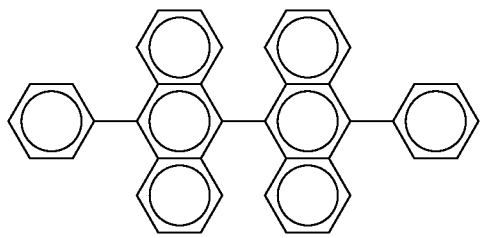

EM1

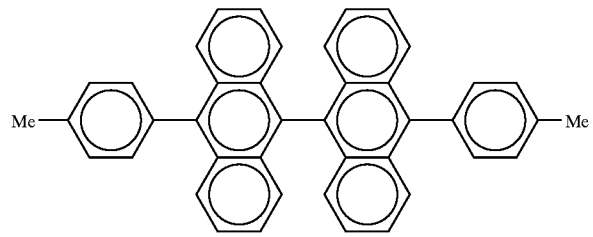

EM2

-continued
EM3
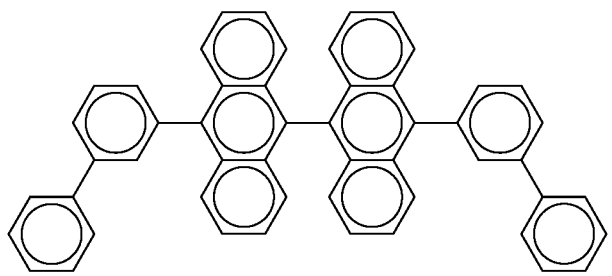
EM4
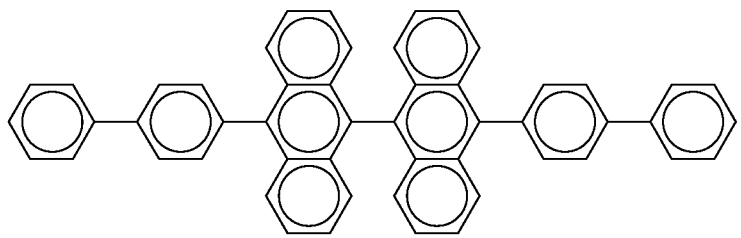
EM5
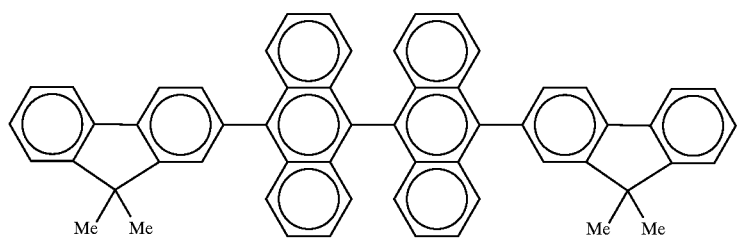
EM6
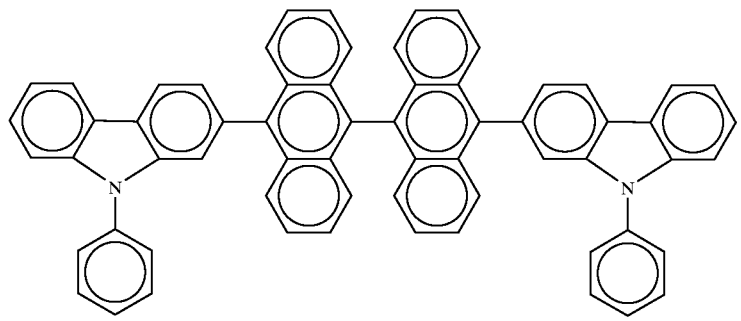
EM7
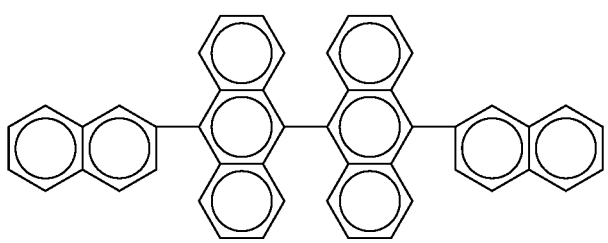
EM8
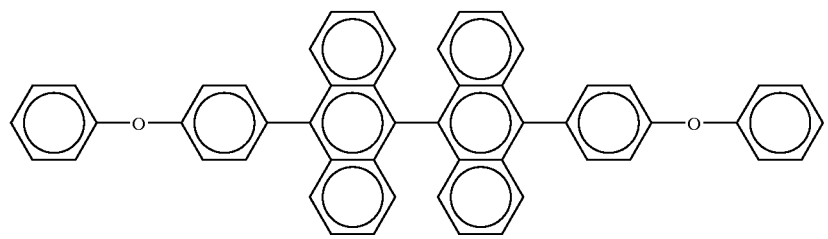

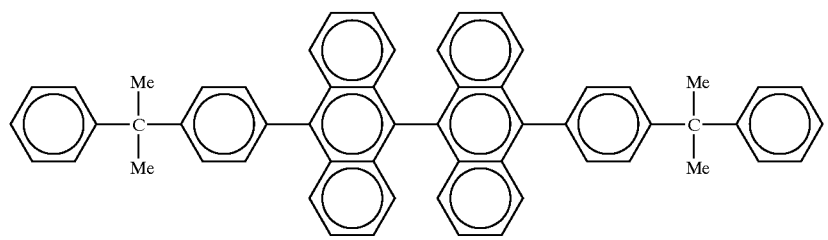
EM9
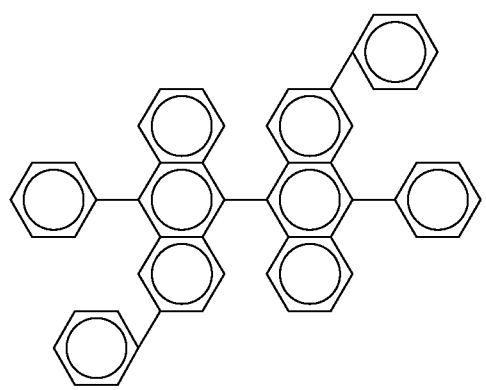
EM10
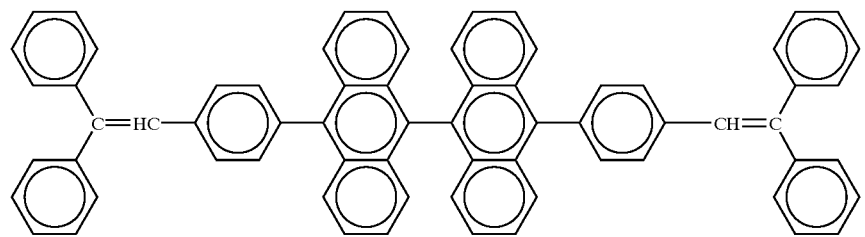
EM11
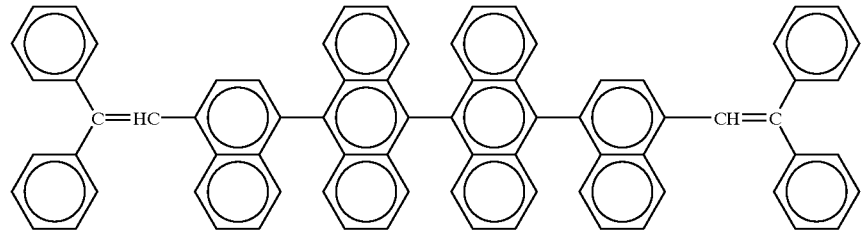
EM12
Specific examples of the anthracene derivative represented by general formula (I-b) include the following compounds:

EM13
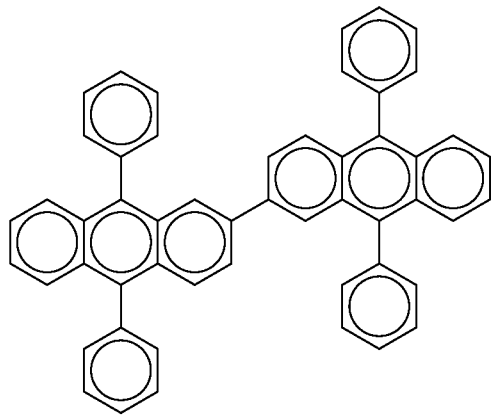
EM14
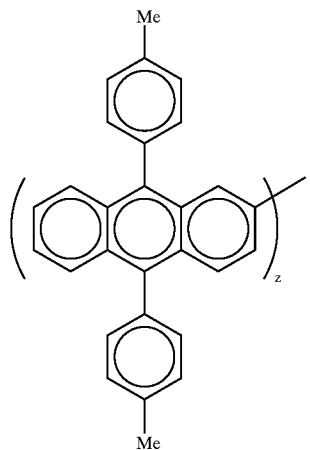
EM15
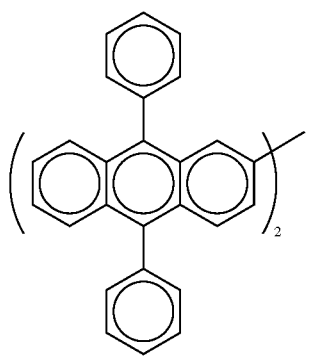
EM16
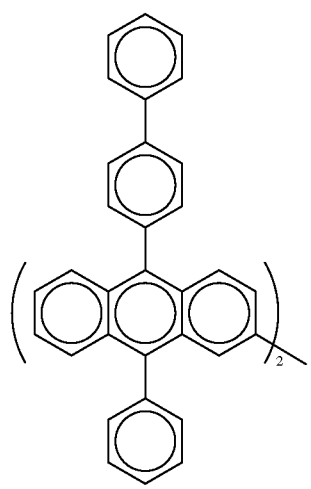
EM17
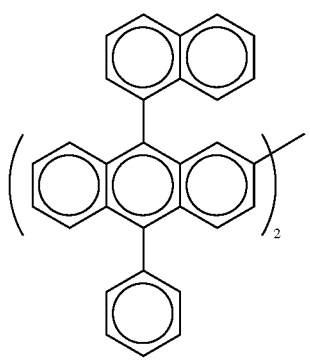
EM18
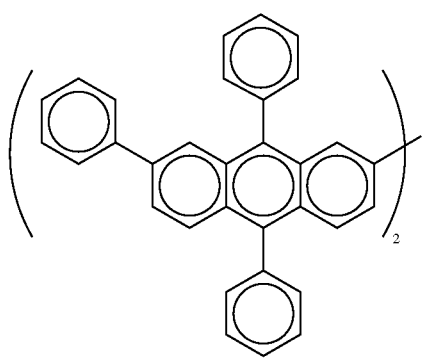

EM19 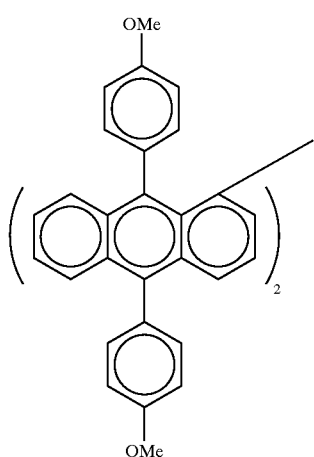 EM20 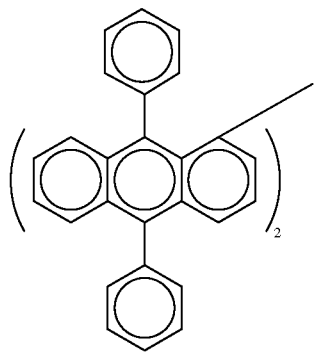
EM21 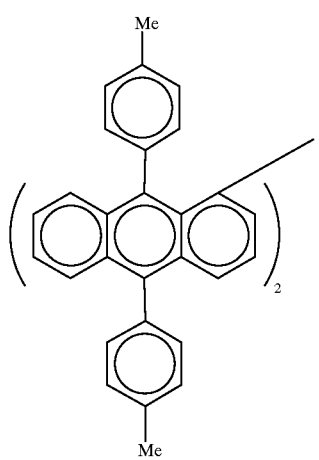 EM22 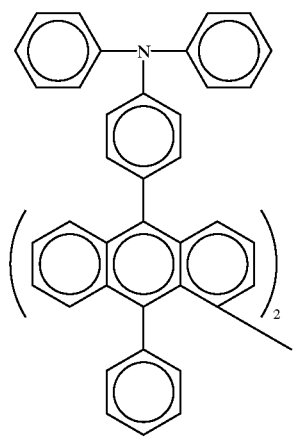
Specific examples of the anthracene derivative represented by general formula (II-a) include the following compounds:
EM23 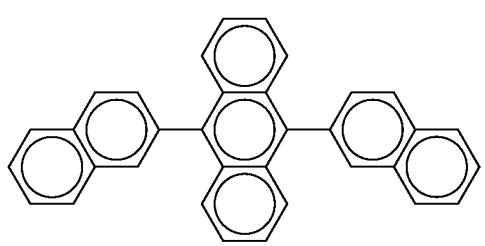 EM24 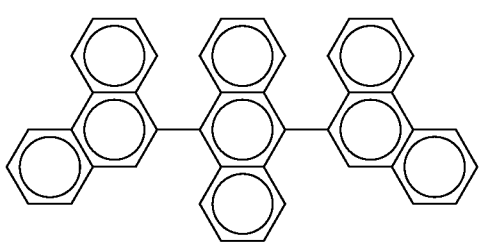
EM25 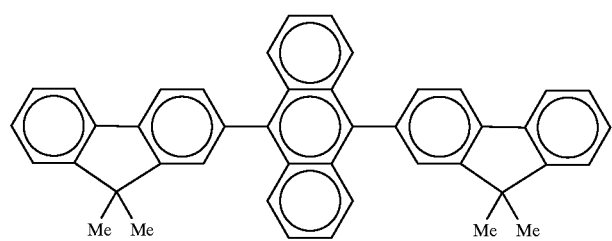

-continued
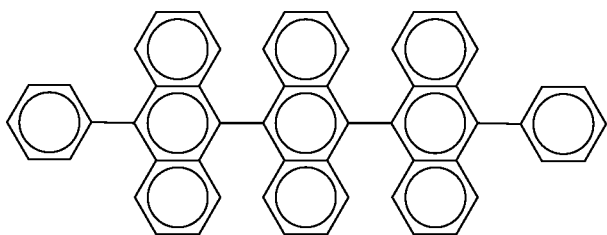
EM26
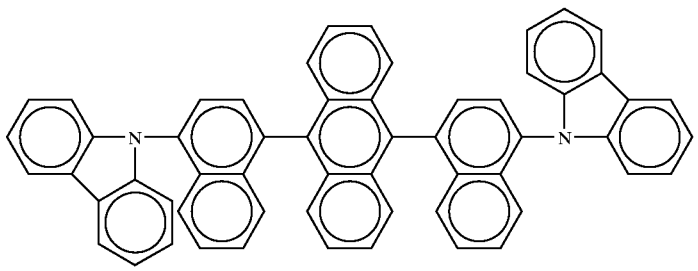
EM27
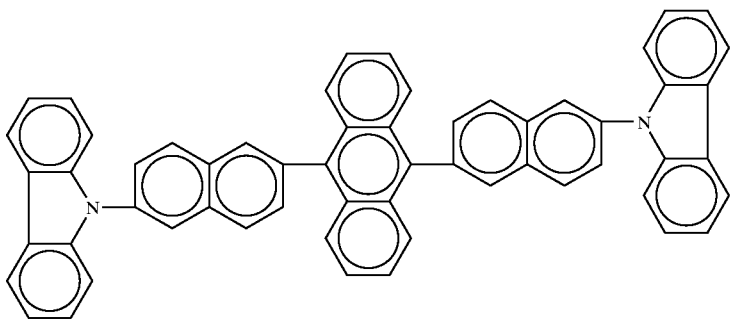
EM28
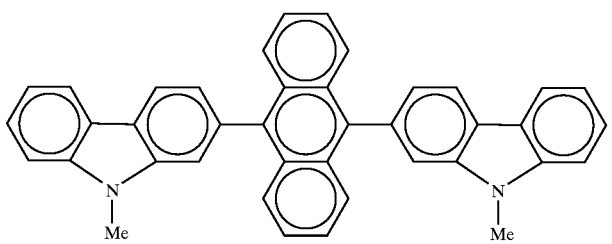
EM29
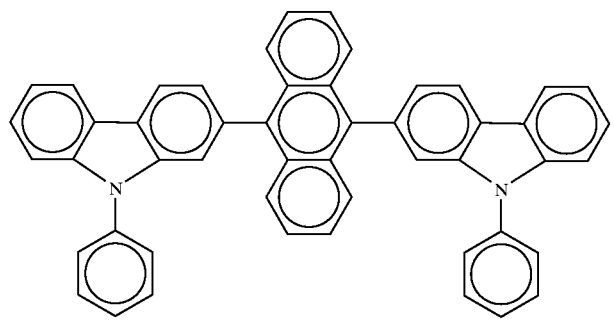
EM30

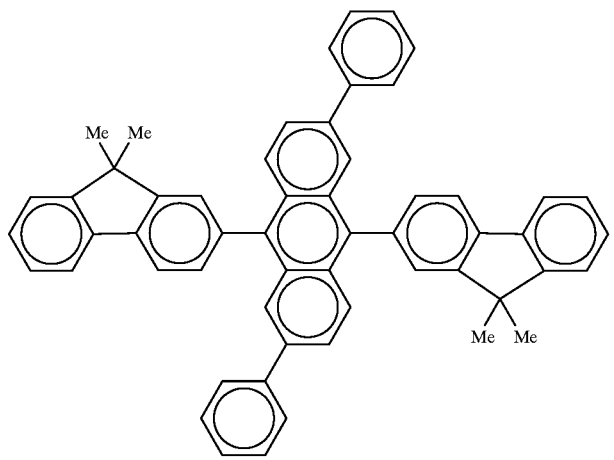
EM31
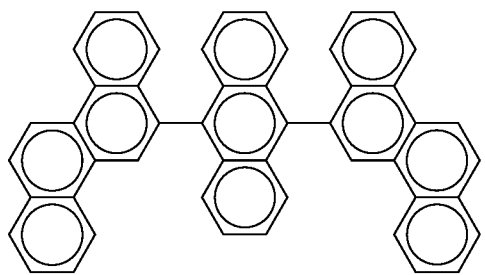
EM32
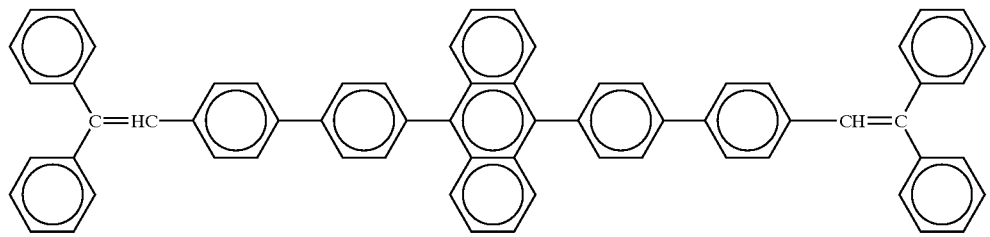
EM33
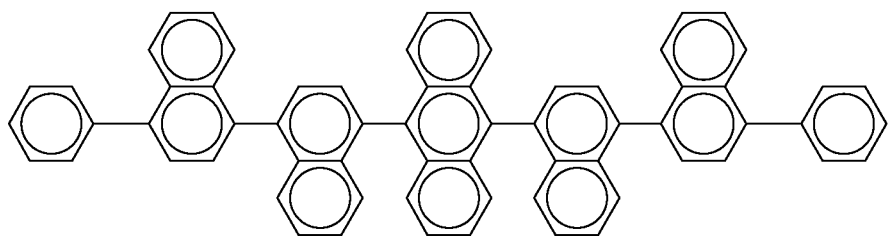
EM34
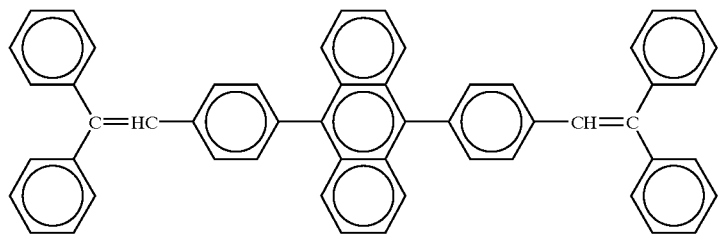
EM35

In the present invention, as the fluorescent compound of component (C) which is used where necessary in the layer of an organic light emitting medium in combination with components (A) and (B) described above, (C-1) styryl derivatives comprising amines and (C-2) condensed polycyclic aromatic compounds are preferable.

Examples of the fluorescent compound of component (C-1) include styryl derivatives comprising amines which is represented by general formula (III):

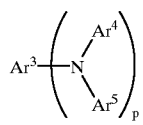
(III)

wherein $Ar^3$, $Ar^4$ and $Ar^5$ each independently represent a substituted or unsubstituted monovalent aromatic group having 6 to 40 carbon atoms, at least one of the groups represented by $Ar^3$, $Ar^4$ and $Ar^5$ comprises a substituted or unsubstituted styryl group and p represents an integer of 1 to 4;

styryl derivatives comprising amines which is represented by general formula (IV):

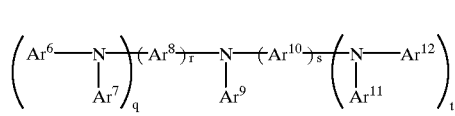
(IV)

wherein $Ar^6$, $Ar^7$, $Ar^9$, $Ar^{11}$ and $Ar^{12}$ each independently represent a substituted or unsubstituted monovalent aromatic group having 6 to 40 carbon atoms, $Ar^8$ and $Ar^{10}$ each independently represent a substituted or unsubstituted divalent aromatic group having 6 to 40 carbon atoms, at least one of the groups represented by $Ar^6$ to $Ar^{12}$ comprises a substituted or unsubstituted styryl group or a substituted or unsubstituted styrylene group, q and t each represent an integer of 0 to 2 and r and s each represent an integer of 1 or 2.

Examples of the monovalent aromatic group having 6 to 40 carbon atoms represented by any of $Ar^3$, $Ar^4$, $Ar^5$, $Ar^6$, $Ar^7$, $Ar^9$, $Ar^{11}$ and $Ar^{12}$ in general formulae (III) and (IV) include phenyl group, naphthyl group, anthranyl group, phenanthryl group, pyrenyl group, coronyl group, biphenyl group, terphenyl group, fluorenyl group, furanyl group, thienyl group, benzothienyl group, indolyl group and carbozolyl group.

Examples of the divalent aromatic group having 6 to 40 carbon atoms represented by any of $Ar^8$ and $Ar^{10}$ in general formula (IV) include phenylene group, naphthylene group, anthranylene group, phenanthrylene group, pyrenylene group, coronylene group, biphenylene group, terphenylene group, furanylene group, thienylene group and fluorenylene group.

Further examples of the monovalent and divalent aromatic groups having 6 to 40 carbon atoms described above include monovalent and divalent residue groups derived from stilbene, distyrylarylenes, tristyrylarylenes and tetrastyrylarylenes.

When the monovalent and divalent groups described above have substituents, examples of the substituent include the groups described as the examples of the substituent in general formulae (I) and (II).

Specific examples of the styryl derivatives comprising amines represented by general formula (III) include the following compounds:

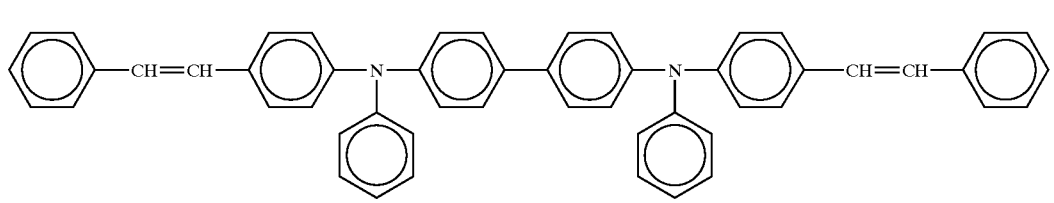
EM36

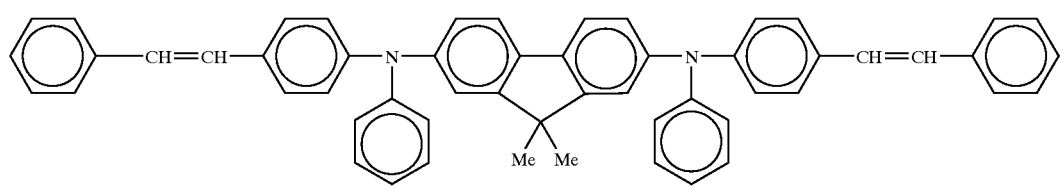
EM37

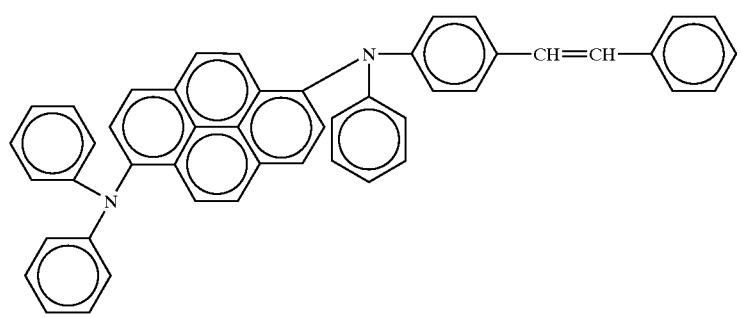
EM38

-continued
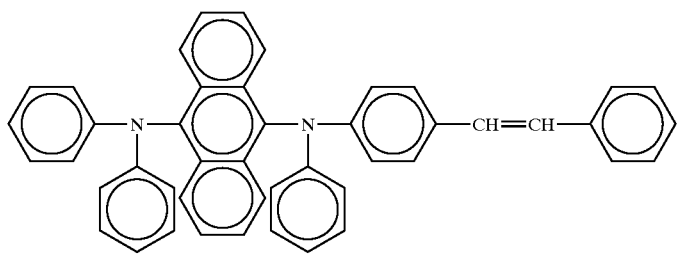
EM39
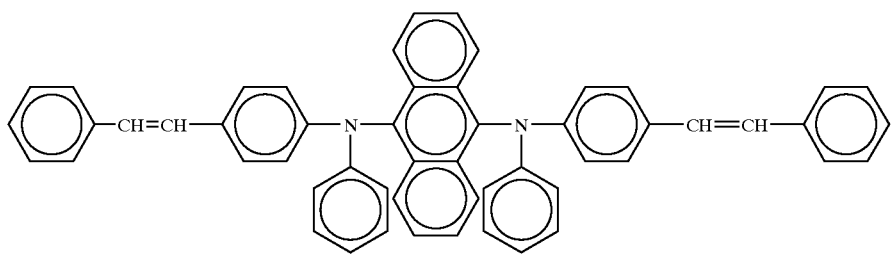
EM40
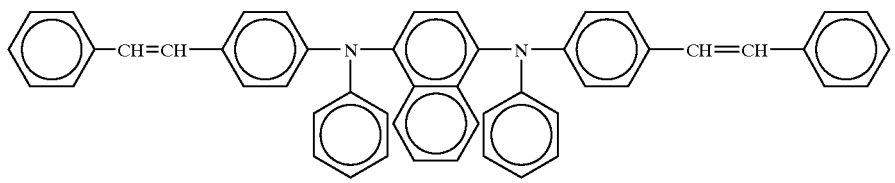
EM41
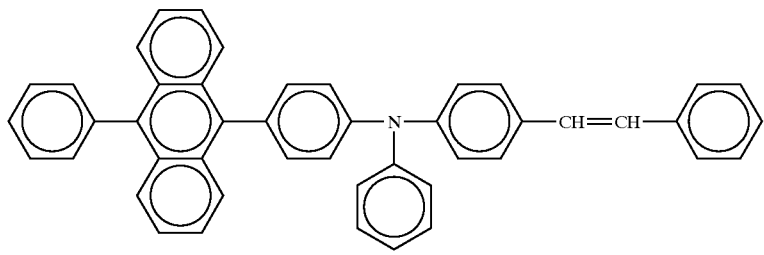
EM42
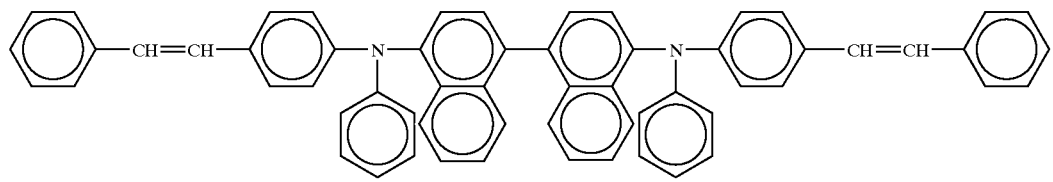
EM43
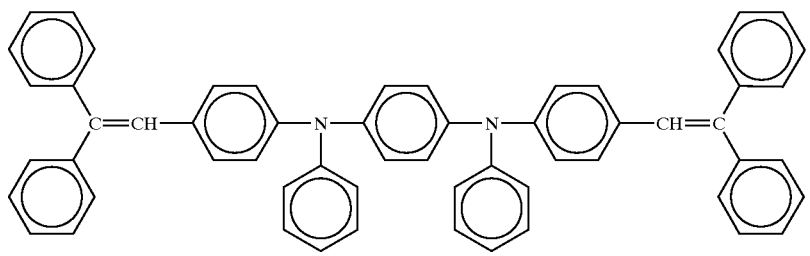
EM44

-continued
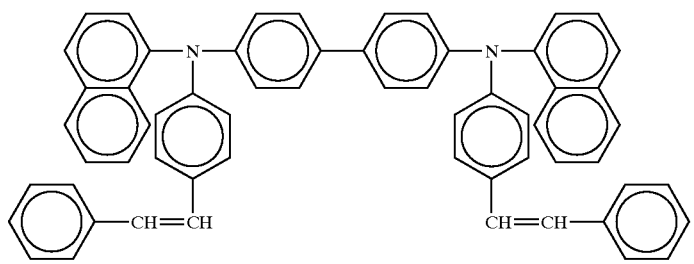
EM45
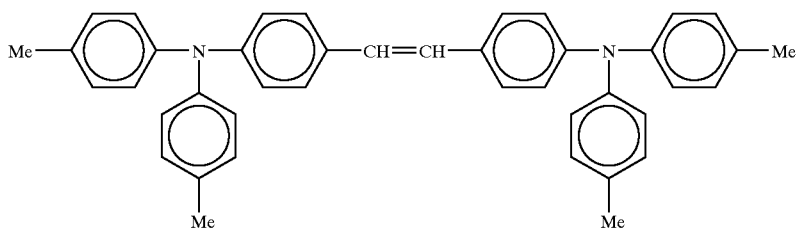
EM46
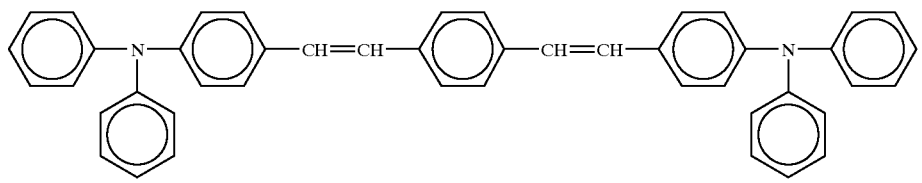
EM47
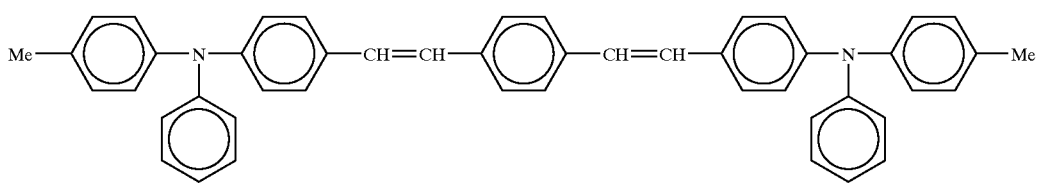
EM48
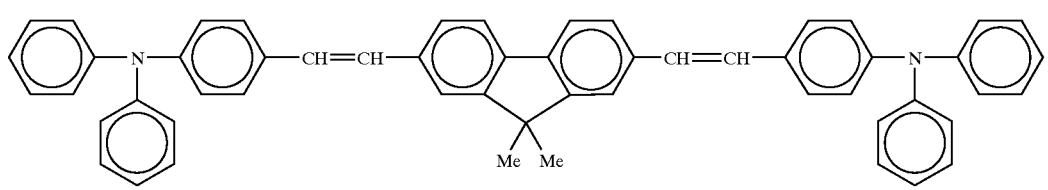
EM49
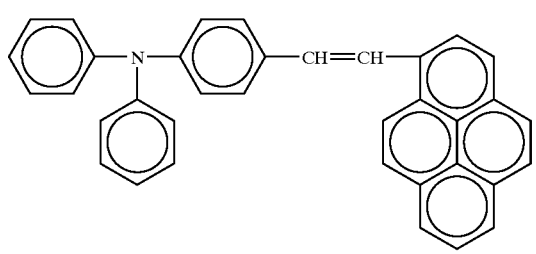
EM50
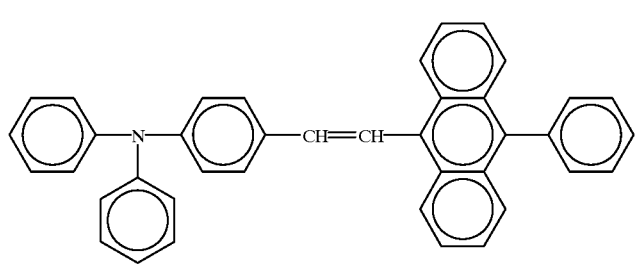
EM51

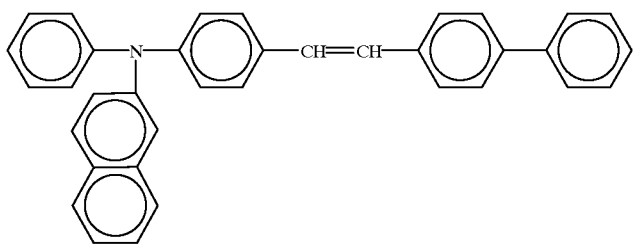
EM52
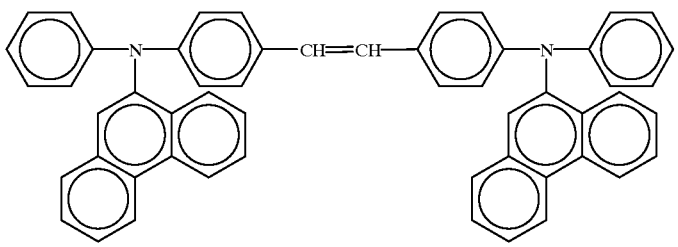
EM53
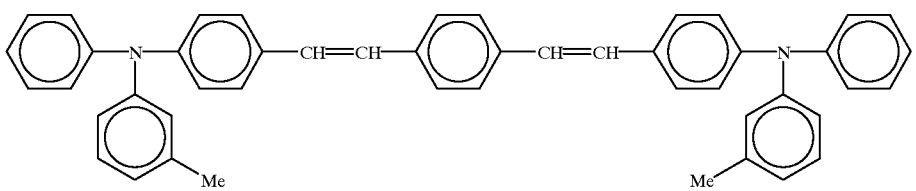
EM54
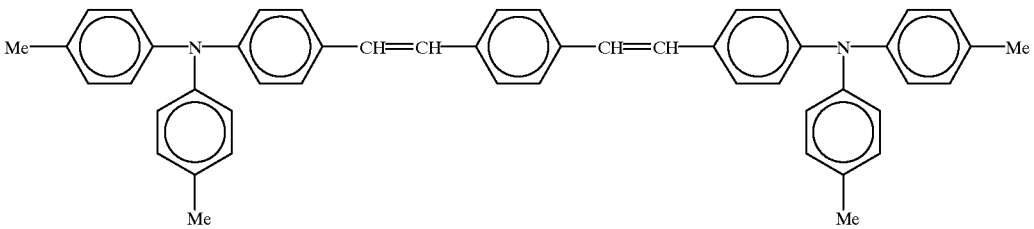
EM55
Specific examples of the styryl derivatives comprising amines represented by general formula (IV) include the following compounds:
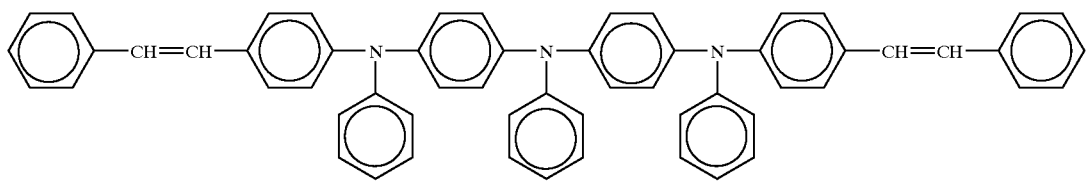
EM56
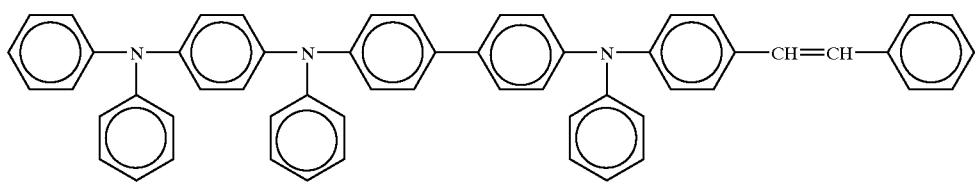
EM57

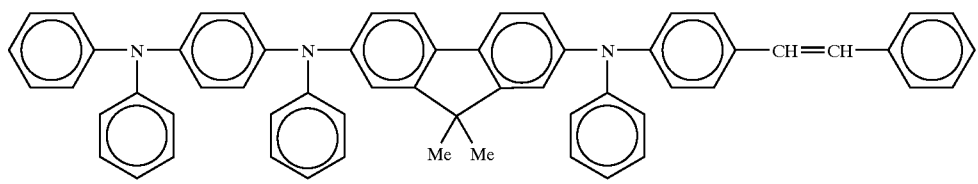
EM58
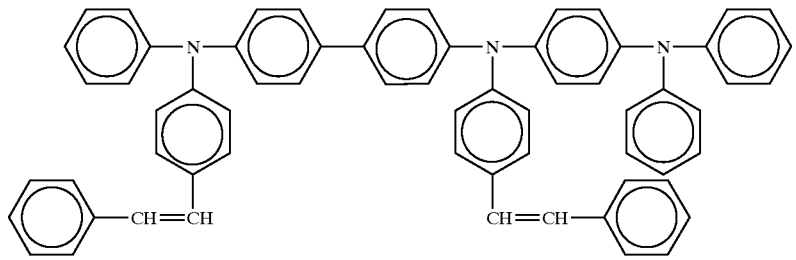
EM59
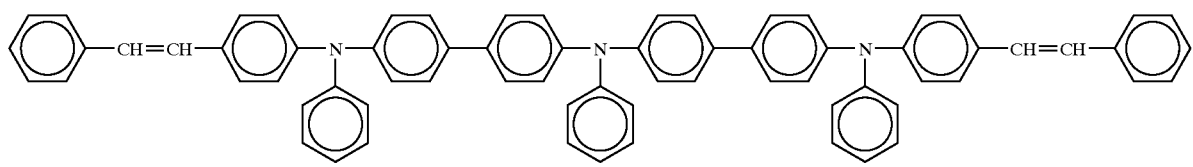
EM60
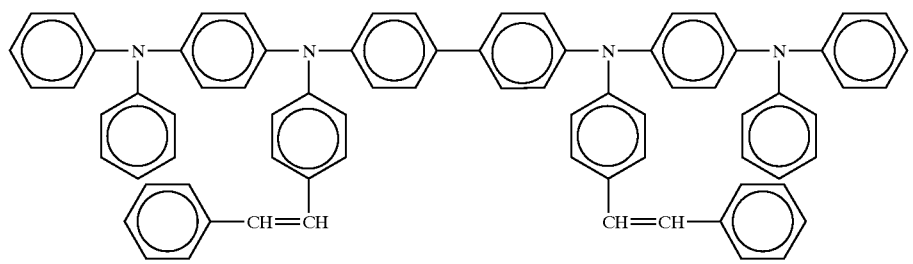
EM61
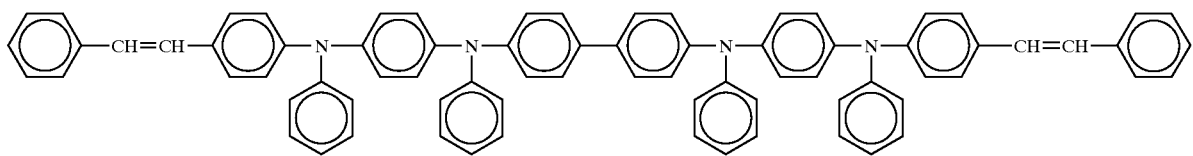
EM62
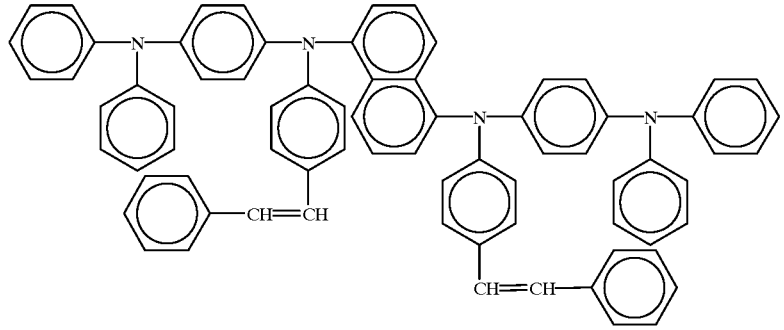
EM63

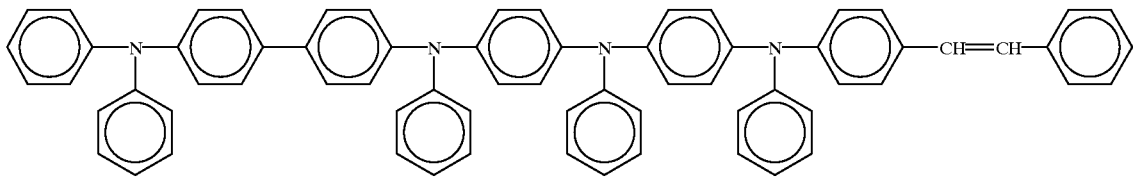

EM64

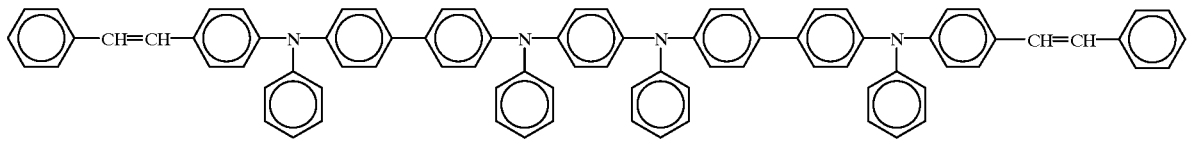

EM65

Examples of the condensed polycyclic aromatic compound of component (C-2) include condensed polycyclic aromatic hydrocarbon compounds and condensed polycyclic aromatic hydrocarbon compounds substituted with amino groups which are obtained by introduction of amino groups into the condensed polycyclic aromatic hydrocarbon compounds.

As the condensed polycyclic aromatic hydrocarbon compound, for example, compounds represented by the following general formula can be used:

(V)

In formula (V), $Ar^{13}$ represents a substituted or unsubstituted monovalent residue group of an aromatic compound. The residue group of an aromatic compound include residue groups of aromatic hydrocarbon compounds and residue groups of aromatic heterocyclic compounds. As the residue group of an aromatic hydrocarbon compound, residue groups of monocyclic or polycyclic aromatic hydrocarbon compounds having 6 to 30 carbon atoms are preferable and the residue groups may be substituted. The ring in the polycyclic compound may be a condensed ring or a non-condensed ring. When the residue groups are substituted, examples of the substituent include alkyl groups, alkoxy groups, aryl groups, aryloxy groups, amino groups and heterocyclic groups. Examples of the above residue group of an aromatic hydrocarbon compound represented by $Ar^{13}$ include phenyl group, alkylphenyl groups, alkoxyphenyl groups, arylphenyl groups, aryloxyphenyl groups, alkenylphenyl groups, aminophenyl groups, naphthyl group, anthryl group, pyrenyl group, perylenyl group and arylalkynyl groups.

As for the alkylphenyl group described above, the alkyl group may be a branched group. Alkyl groups having 1 to 10 carbon atoms are preferable. Examples of the alkyl group include methyl group, ethyl group, various types of propyl group, various types of butyl group, various types of pentyl groups and various types of hexyl group. The alkyl group may be substituted at any of the o-, m- and p-positions of the phenyl group. Typical examples of the alkylphenyl group include o-, m- and p-tolyl groups, 4-n-butylphenyl group and 4-t-butylphenyl group. As for the arylphenyl group described above, it is preferable that the aryl group is phenyl group. The phenyl group may be substituted with an alkyl group or the like. Examples of the alkyl group as this substituent include the alkyl groups described as the examples of the alkyl group in alkylphenyl groups. The aryl portion may be phenyl group substituted with an aryl group such as phenyl group. Typical examples of the arylphenyl group include o-, m- and p-biphenylyl group, 4-triphenyl group, 3-triphenyl group and terephenylyl group. As for the alkenylphenyl group described above, it is preferable that the total number of carbon atoms in the alkenyl group is 2 to 20. Diarylalkenyl groups are more preferable as the alkenyl group. Examples of the diarylalkenyl group include diphenylvinyl group, ditolylvinyl group and dibiphenylvinyl group. Typical examples of the alkenylphenyl group include triphenylvinylphenyl group. As for the aminophenyl group described above, it is preferable that the amino group is a diarylamino group. Examples of the diarylamino group include diphenylamino group and phenyltolylamino group. Typical examples of the aminophenyl group include diphenylaminophenyl group and phenyltolylaminophenyl group. As for the naphthyl group described above, examples of the naphthyl group include 1-naphthyl group and 2-naphthyl group. As for the arylalkynyl group described above, arylalkynyl groups having 8 to 20 carbon atoms are preferable. Examples of the arylakynyl group include phenylethynyl group, tolylethynyl group, biphenylylethynyl group, naphthylethynyl group, diphenylaminophenylethynyl group, N-phenyltolylaminophenylethynyl group and phenylpropyl group.

When $Ar^{13}$ represents a residue group of an aromatic heterocyclic compound, it is preferable that the group comprises a five-membered or six-membered ring having O, N or S as the hetero atom. Examples of the residue group of an aromatic heterocyclic compound include thienyl group, furyl group, pyrrolyl group and pyridyl group. The residue group of an aromatic heterocyclic compound may have substituents. When the group has substituents, examples of the substituent include the groups described as the examples of the substituent in the residue groups of aromatic hydrocarbon compounds.

The number of the aromatic hydrocarbon rings and the aromatic heterocyclic rings in the entire residue groups represented by $A^{13}$ which are present in the polycyclic aromatic compound represented by general formula (V) is not particularly limited as long as the number is at least 2. From the standpoint of preventing association between the fluorescent molecules in the light emitting medium, it is preferable that the number is 6 or greater.

In the above general formula, U represents a residue group which is derived from a condensed polycyclic aromatic compound having 4 to 10 rings and preferably 4 to 6 rings and has a valency of m. m represents an integer of 2 to 8 and preferably an integer of 2 to 6. The condensed polycyclic aromatic compound includes condensed polycyclic aromatic hydrocarbon compounds and condensed polycyclic aromatic heterocyclic compounds. Examples of the condensed polycyclic aromatic hydrocarbon compound include naphthacene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, benzo[a]naphthacene, hexacene and anthanthrene. Examples of the condensed polycyclic heterocyclic compound include naphtho[2,1-f]isoquinoline, α-naphthaphenanthridine, phenanthroxazole, quinolino[6,5-f]quinoline, benzo[b]thiophanthrene, benzo[g]-thiophanthrene, benzo[i]thiophanthrene and benzo[b]thiophanthraquinone.

In the present invention, it is preferable that U represents a residue group of a condensed polycyclic aromatic hydrocarbon compound which has a valency of 2 to 8 and more preferably a valency of 2 to 6.

Examples of the condensed polycyclic aromatic hydrocarbon compound as the base of the residue group of a condensed polycyclic aromatic hydrocarbon compound represented by U in general formula (V) include the following compounds:

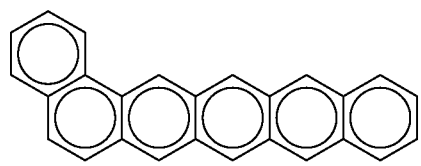

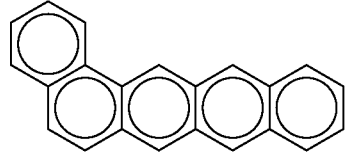

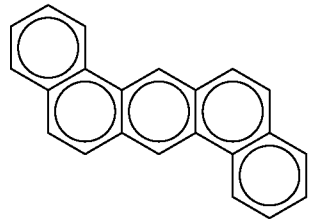

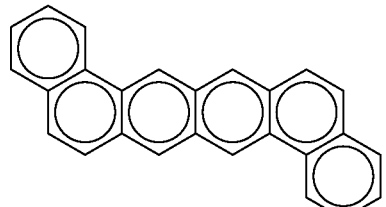

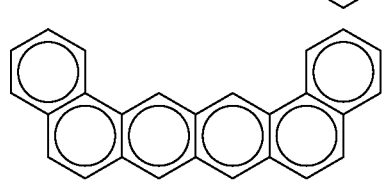

-continued

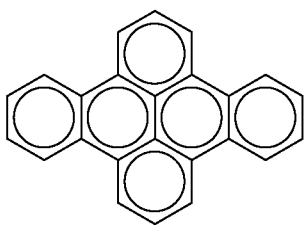

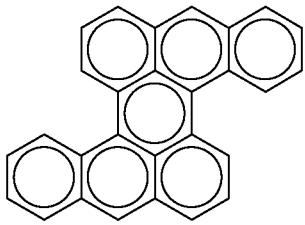

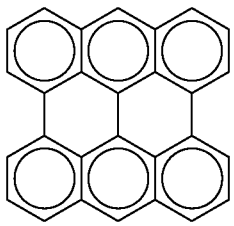

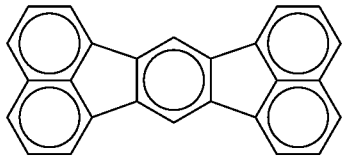

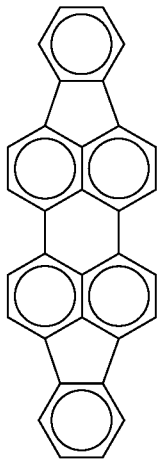

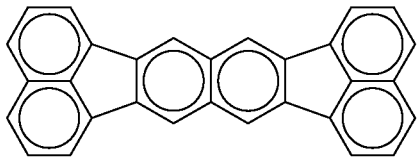

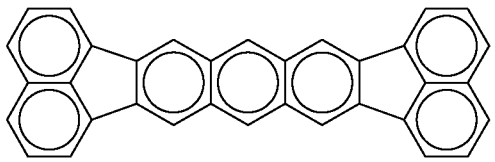

When the condensed polycyclic aromatic compound of component (C-2) is a condensed polycyclic aromatic compound substituted with an amino group, for example, compounds represented by the following general formula can be used:

$$(Ar^{13})_m—U—(Am)_n \quad (VI)$$

In general formula (VI), $Ar^{13}$ are as defined in general formula (V) and substituents are also as defined in general formula (V). Am represents a monovalent group which comprises nitrogen atom and a substituent group comprising at least one carbon ring bonded to the nitrogen atom. Examples of the group represented by Am include diarylamino groups, dialkylamino groups and alkylarylamino groups. U in the above general formula represents a residue group of a condensed polycyclic aromatic hydrocarbon compound, which has 3 to 10 rings and a valency of 1 to 12. Therefore, the residue group represented by U in general formula (VI) include the residue groups of condensed polycyclic aromatic hydrocarbon compounds represented by U in general formula (V) and, moreover, residue groups of anthracene and the like compounds. m represents an integer of 0 to 8 and n represents an integer of 1 to 4.

As the fluorescent compound used as component (C) in the present invention, the same effect can be exhibited by compounds other than compounds (C-1) and (C-2), such as quinacridone compounds represented by the following general formula:

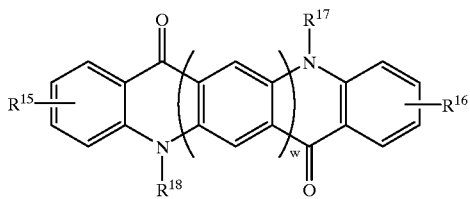

wherein $R^{15}$ and $R^{16}$ each represent an alkyl group, an alkoxy group, a substituted alkyl group, an aryl group or a halogenated condensed aryl group, $R^{17}$ and $R^{18}$ each represent an alkyl group, an alkoxy group, a substituted alkyl group, an aryl group or a substituted aryl group and w represents an integer of 1 to 3; and coumarine compounds represented by the following general formula:

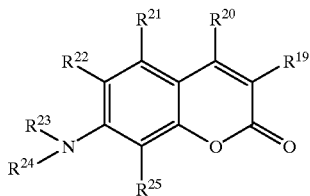

wherein $R^{19}$, $R^{20}$ and $R^{21}$ each represent hydrogen atom, cyano group, carboxyl group, a substituted or unsubstituted alkyl group, a substituted or unsubstituted aryl group, an acyl group, an ester group or a substituted or unsubstituted heterocyclic group, may represent the same group or different groups and may form rings by forming bonds between each other, $R^{22}$ and $R^{25}$ each represent hydrogen atom, an alkyl group or an aryl group, $R^{22}$ and $R^{25}$ each represent an alkyl group or an aryl group and pairs of groups represented by $R^{22}$ and $R^{23}$, $R^{23}$ and $R^{24}$, and $R^{24}$ and $R^{25}$ may form rings by forming bonds between each other.

In the present invention, the fluorescent compound of component (C) may be used singly or in combination of two or more.

In the present invention, it is advantageous that the amounts of the electron transporting compound of component (A) and the anthracene derivative of component (B) used in the layer of an organic light emitting medium are suitably selected in accordance with the type of the used compounds in a manner such that the ratio of the amount by mass of component (A) to the amount by mass of component (B) is in the range of 1:99 to 99:1. It is preferable that the amounts are selected in a manner such that the ratio of the amount by mass of component (A) to the amount by mass of component (B) is in the range of 1:9 to 9:1 and more preferably in the range of 9:1 to 1:1. When the amounts are selected in the above range, in particular, a long life time can be obtained.

The fluorescent compound of component (C) which is used where necessary is used in an amount such that the ratio of the total amount by mass of component (A) and component (B) to the amount by mass of component (C) is in the range of 100:1 to 1:10 and more preferably in the range of 100:2 to 1:1.

It is preferable that the thickness of the layer of an organic light emitting medium is in the range of 5 to 200 nm and more preferably in the range of 10 to 40 nm since the voltage applied to the device can be decreased to a great degree. By using the combination of component (A) and component (B) for the layer of an organic light emitting medium, the organic light emitting medium becomes more amorphous due to suppressed crystallization. Therefore, stability is enhanced and heat resistance is improved. As the compound of component (B), compounds having a glass transition temperature of 110° C. or higher are preferable. By mixing the compound having a glass transition temperature of 110° C. or higher, the glass transition temperature of the layer of an organic light emitting medium can be raised to 110° C. or higher and a heat resistance of 500 hours or longer at 85° C. can be obtained.

The chromaticity and the peak wavelength in the spectrum of the emitted light can be controlled by adjusting the relative amounts of component (A) and component (B). By increasing the relative amount of component (A), the peak wavelength in the spectrum of the emitted light shifts to longer wavelengths and the x-coordinate of the chromaticity coordinates increases. This phenomenon takes place because the peak wavelength in the spectrum of emitted light due to component (A) is in the region of longer wave lengths.

It is preferable that the fluorescent compound of component (C) is added since the heat resistance and the efficiency of light emission are further improved.

The organic EL device comprises a pair of electrodes and a layer of an organic light emitting medium (referred to as a light emitting medium layer, hereinafter) comprising a combination of component (A), component (B) and component (C) used where necessary which are described above and disposed between the pair of electrodes. It is preferable that various intermediate layers are disposed between the electrodes and the light emitting medium layer. Examples of the intermediate layer include a hole injecting layer, a hole transporting layer, an electron injecting layer and an electron transporting layer. It is known that various organic and inorganic compounds can be used for these layers.

Typical examples of the construction of the organic EL device include:

(1) An anode/a light emitting medium layer/a cathode;
(2) An anode/a hole injecting layer/a light emitting medium layer/a cathode;
(3) An anode/a light emitting medium layer/an electron injecting layer/a cathode;

(4) An anode/a hole injecting layer/a light emitting medium layer/an electron injecting layer/a cathode;

(5) An anode/an organic semiconductor layer/a light emitting medium layer/a cathode;

(6) An anode/an organic semiconductor layer/an electron barrier layer/a light emitting medium layer/a cathode;

(7) An anode/an organic semiconductor layer/a light emitting medium layer/an adhesion improving layer/a cathode; and (8) An anode/a hole injecting layer/a hole transporting layer/a light emitting medium layer/an electron injecting layer/a cathode.

However, the construction of the organic EL device is not limited to the above examples.

In general, the organic EL device is prepared on a substrate which transmits light. The substrate which transmits light is the substrate which supports the organic EL device. It is preferable that the substrate which transmits light has a transmittance of light of 50% or greater and more preferably 80% or greater in the visible region of 400 to 700 nm. It is also preferable that a flat and smooth substrate is used.

As the substrate which transmits light, for example, glass plates and synthetic resin plates are advantageously used. Specific examples of the glass plates include plates made of soda ash glass, glass containing barium and strontium, lead glass, aluminosilicate glass, borosilicate glass, barium borosilicate glass and quartz. Specific examples of the synthetic resin plates include plates made of polycarbonate resins, acrylic resins, polyethylene terephthalate resins, polyether sulfide resins and polysulfone resins.

As the anode, an electrode made of a material such as a metal, an alloy, a conductive compound and a mixture of these materials which has a great work function (4 eV or more) is preferably used. Specific examples of the material for the anode include metals such as Au and conductive materials such as CuI, ITO (indium tin oxide), $SnO_2$, ZnO and In—Zn—O. The anode can be prepared by forming a thin film of the electrode material described above in accordance with a process such as the vapor deposition process and the sputtering process. When the light emitted from the light emitting medium layer is obtained through the anode, it is preferable that the anode has a transmittance of the emitted light greater than 10%. It is also preferable that the sheet resistivity of the anode is several hundred Ω/□ or smaller. The thickness of the anode is, in general, selected in the range of 10 nm to 1 μm and preferably in the range of 10 to 200 nm although the preferable range may be different depending on the used material.

As the cathode, an electrode made of a material such as a metal, an alloy, a conductive compound and a mixture of these materials which has a small work function (4 eV or smaller) is used. Specific examples of the material for the cathode include sodium, sodium-potassium alloys, magnesium, lithium, magnesium-silver alloys, aluminum/aluminum oxide, Al/$Li_2O$, Al/$LiO_2$, Al/LiF, aluminum-lithium alloys, indium and rare earth metals.

The cathode can be prepared by forming a thin film of the material described above in accordance with a process such as the vapor deposition process and the sputtering process. When the light emitted from the light emitting medium layer is obtained through the cathode, it is preferable that the cathode has a transmittance of the emitted light greater than 10%. It is also preferable that the sheet resistivity of the cathode is several hundred Ω/□ or smaller. The thickness of the cathode is, in general, selected in the range of 10 nm to 1 μm and preferably in the range of 50 to 200 nm.

In the organic EL device of the present invention, it is preferable that a layer of a chalcogenide, a metal halide or a metal oxide (this layer may occasionally be referred to as a surface layer) is disposed on the surface of at least one of the pair of electrodes prepared as described above. Specifically, it is preferable that a layer of a chalcogenide (including an oxide) of a metal such as silicon and aluminum is disposed on the surface of the anode at the side of the light emitting medium layer and a layer of a metal halide or a metal oxide is disposed on the surface of the cathode at the side of the light emitting medium layer. Due to the above layers, stability in driving can be improved.

Preferable examples of the chalcogenide include $SiO_x$ ($1 \leq x \leq 2$), $AlO_x$ ($1 \leq x \leq 1.5$), SiON and SiAlON. Preferable examples of the metal halide include LiF, $MgF_2$, $CaF_2$ and fluorides of rare earth metals. Preferable examples of the metal oxide include $Cs_2O$, $Li_2O$, MgO, SrO, BaO and CaO.

In the organic EL device of the present invention, the electron transporting property and the hole transporting property of the light emitting medium layer are simultaneously improved by suitably adjusting the relative amounts of component (A) and component (B) described above and the above intermediate layers such as the hole injecting layer, the hole transporting layer and the electron injecting layer can be omitted. In this case, the surface layers may be disposed. It is preferable that the surface layers are disposed.

In the organic EL device of the present invention, it is preferable that a mixed region of an electron transmitting compound and a reducing dopant or a mixed region of a hole transmitting compound and an oxidizing dopant is disposed on the surface of at least one of the pair of electrodes prepared as described above. Due to the mixed region disposed on the surface of the pair of electrodes, the electron transmitting compound is reduced to form an anion and injection and transportation of electrons from the mixed region into the light emitting medium can be facilitated. The hole transmitting compound is oxidized to form a cation and injection and transportation of holes from the mixed region into the light emitting medium is facilitated. Preferable examples of the oxidizing dopant include various types of Lewis acid and acceptor compounds. Preferable examples of the reducing dopant include alkali metals, compounds of alkali metals, alkaline earth metals, rare earth metals and compounds of these metals.

In the organic EL device of the present invention, the light emitting medium layer has the following functions:

(1) The injecting function: the function of injecting holes from the anode or the hole injecting layer and injecting electrons from the cathode or the electron injecting layer when an electric field is applied;

(2) The transporting function: the function of transporting injected charges (electrons and holes) by the force of the electric field; and (3) The light emitting function: the function of providing the field for recombination of electrons and holes and leading the recombination to the emission of light.

As the process for forming the light emitting medium layer, a conventional process such as the vapor deposition process, the spin coating process and the Langmuir-Blodgett process (the LB process) can be used. It is particularly preferable that the light emitting medium layer is a molecular deposit film. The molecular deposit film is a thin film formed by deposition of a material compound in the gas phase or a thin film formed by solidification of a material compound in a solution or in the liquid phase. In general, the molecular deposit film can be distinguished from the thin film formed in accordance with the LB process (the molecular accumulation film) based on the differences in the aggregation structure and higher order structures and functional differences caused by these structural differences.

As disclosed in Japanese Patent Application Laid-Open No. Showa 57(1982)-51781, the light emitting medium layer can also be formed by dissolving a binder such as a resin and the material compounds into a solvent to prepare a solution, followed by forming a thin film from the prepared solution in accordance with the spin coating process or the like.

In the present invention, where desired, conventional light emitting media other than component (A), component (B) and component (C) described above may be comprised in the light emitting medium layer or a light emitting medium layer comprising other conventional light emitting media may be laminated to the light emitting medium layer comprising the compounds described in the present invention as long as the object of the present invention is not adversely affected.

The hole injecting and transporting layer is a layer which helps injection of holes into the light emitting medium layer and transports the holes to the light emitting region. The layer exhibits a great mobility of holes and, in general, has an ionization energy as small as 5.5 eV or smaller. For the hole injecting and transporting layer, a material which transports holes to the light emitting medium layer at a smaller electric field strength is preferable. A material which exhibits, for example, a mobility of holes of at least $10^{-6}$ $cm^2/V \cdot sec$ under application of an electric field of $10^4$ to $10^6$ V/cm is more preferable. A material can be selected from materials which are conventionally used as the charge transporting material of holes in photoconductive materials and conventional materials which are used for the hole injecting layer in organic EL devices and used as the hole injecting and transporting material.

To form the hole injecting and transporting layer, a thin film may be formed from a hole injecting and transporting material in accordance with a conventional process such as the vacuum vapor deposition process, the spin coating process, the casting process and the LB process. The thickness of the hole injecting and transporting layer is not particularly limited. In general, the thickness is 5 nm to 5 $\mu$m.

The electron injection layer is a layer which helps injection of electrons into the light emitting medium layer and exhibits a great mobility of electrons. The adhesion improving layer is an electron injecting layer made of a material exhibiting excellent adhesion with the cathode. As the material for the electron injecting layer, metal complexes of 8-hydroxyquinoline and derivatives thereof are preferably used. Specific examples of the metal complexes of 8-hydroxyquinoline and derivatives thereof include metal chelates of oxinoid compounds including chelates of oxine (in general, 8-quinolinol or 8-hydroxyquinoline). For example, tris(8-quinolinol)aluminum can be used as the electron injecting material.

To prepare the organic EL device of the present invention, for example, the anode, the light emitting medium layer and, where necessary, the hole injecting layer and the electron injecting layer are formed in accordance with the above process using the above materials and the cathode is formed in the last step. The organic EL device may be prepared by forming the above layers in the order reverse to that described above, i.e., the cathode being formed in the first step and the anode in the last step.

An embodiment of the process for preparing an organic EL device having a construction in which an anode, a hole injecting layer, a light emitting medium layer, an electron injecting layer and a cathode are disposed successively on a substrate which transmits light will be described in the following.

On a suitable substrate which transmits light, a thin film made of a material for the anode is formed in accordance with the vapor deposition process or the sputtering process so that the thickness of the formed thin film is 1 $\mu$m or smaller and preferably in the range of 10 to 200 nm. The formed thin film is used as the anode. Then, a hole injecting layer is formed on the anode. The hole injecting layer can be formed in accordance with the vacuum vapor deposition process, the spin coating process, the casting process or the LB process, as described above. The vacuum vapor deposition process is preferable because a uniform film can be easily obtained and the possibility of formation of pin holes is small. When the hole injecting layer is formed in accordance with the vacuum vapor deposition process, in general, it is preferable that the conditions are suitably selected in the following ranges: the temperature of the source of the deposition: 50 to 450° C.; the vacuum: $10^{-7}$ to $10^{-3}$ Torr; the rate of deposition: 0.01 to 50 nm/second; the temperature of the substrate: −50 to 300° C. and the thickness of the film: 5 nm to 5 $\mu$m; although the conditions of the vacuum vapor deposition are different depending on the used compound (the material for the hole injecting layer) and the crystal structure and the recombination structure of the hole injecting layer to be formed.

Then, the light emitting medium layer is formed on the hole injecting layer formed above. Using the light emitting medium described in the present invention, a thin film of the organic light emitting medium can be formed in accordance with the vacuum vapor deposition process, the sputtering process, the spin coating process or the casting process and the formed thin film is used as the light emitting medium layer. The vacuum vapor deposition process is preferable because a uniform film can be easily obtained and the possibility of formation of pin holes is small. When the light emitting medium layer is formed in accordance with the vacuum vapor deposition process, in general, the conditions of the vacuum vapor deposition process can be selected in the same ranges as those described for the vacuum vapor deposition of the hole injecting layer although the conditions are different depending on the used compound. It is preferable that the thickness is in the range of 10 to 40 nm.

An electron injecting layer is formed on the light emitting medium layer formed above. Similarly to the hole injecting layer and the light emitting medium layer, it is preferable that the electron injecting layer is formed in accordance with the vacuum vapor deposition process since a uniform film must be obtained. The conditions of the vacuum vapor deposition can be selected in the same ranges as those described for the vacuum vapor deposition of the hole injecting layer and the light emitting medium layer.

A cathode is formed on the above layers in the last step and an organic EL device can be obtained. The cathode is made of a metal and can be formed in accordance with the vacuum vapor deposition process or the sputtering process. It is preferable that the vacuum vapor deposition process is used in order to prevent formation of damages on the lower organic layers during the formation of the film.

In the above preparation of the organic EL device, it is preferable that the above layers from the anode to the cathode are formed successively while the preparation system is kept in a vacuum after being evacuated.

The electroluminescence device which can be prepared as described above emits light by applying a direct voltage of 3 to 40 V in the condition that the anode is connected to a positive electrode (+) and the cathode is connected to a negative electrode (−). When the connection is reversed, no electric current is observed and no light is emitted at all. When an alternating voltage is applied to the electroluminescence device, light emission is observed only in the condition that the polarity of the anode is positive and the polarity of the cathode is negative. When an alternating voltage is applied to the organic EL device, any type of wave shape can be used.

The present invention also provides the organic light emitting medium comprising component (A), component (B) and component (C) used where necessary, which are described above. The organic light emitting medium can be advantageously used for the organic EL device which exhibits excellent heat resistance, has a long life time and provides efficient light emission.

The present invention will be described more specifically with reference to examples in the following. However, the present invention is not limited to the examples.

EXAMPLE 1

In accordance with conventional processes described in literatures, the following compounds DPVDPAN, TPD78, TPD106, PAVB, Ru11, DC5 and Rub6P were synthesized and purified.

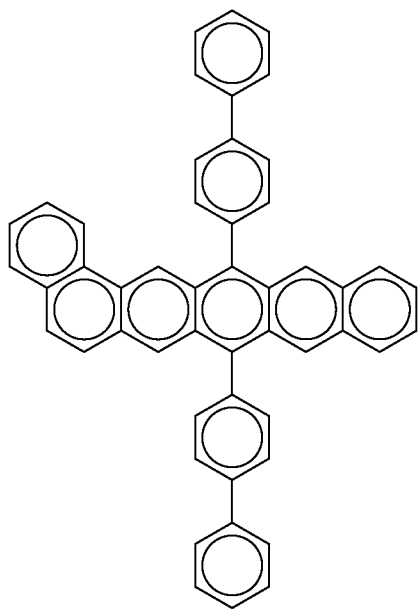

Ru11

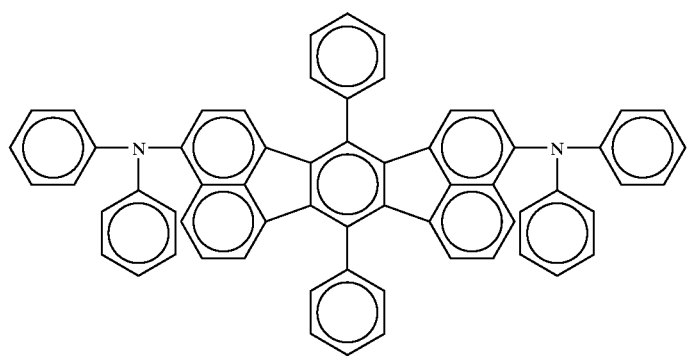

DC5

-continued

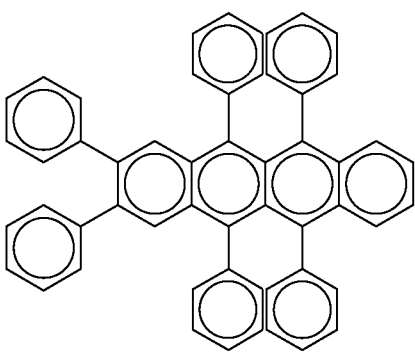

Rub6P

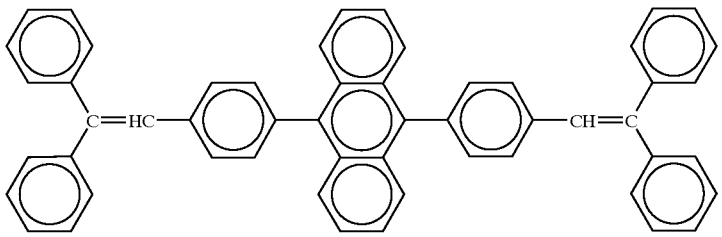

DPVDPAN

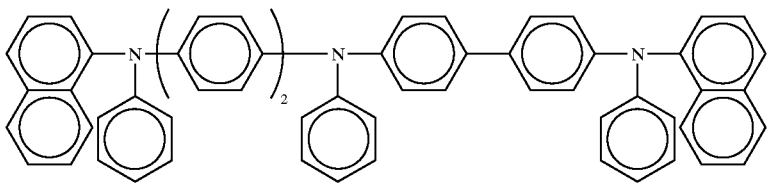

TPD 78

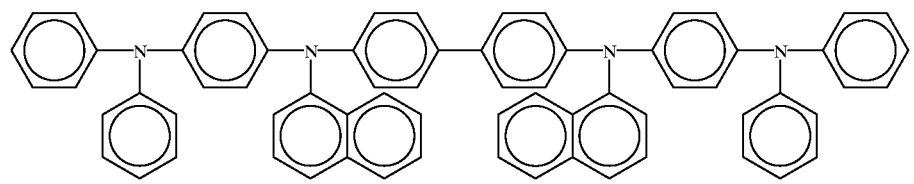

TPD 106

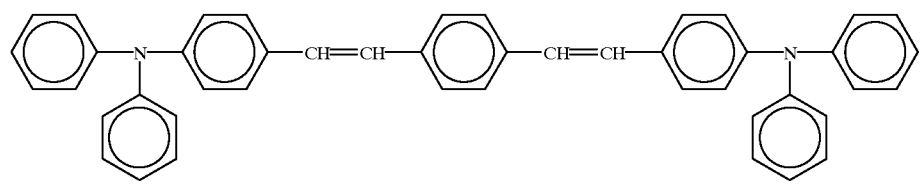

PAVB

On a glass plate having a size of 25×75×1.1 mm, a transparent electrode made of indium tin oxide and having a thickness of 120 nm was formed. After the glass substrate was cleaned by irradiation with ultraviolet light and exposure to ozone, the glass substrate was placed in a vacuum vapor deposition apparatus.

In the first step, TPD106 was vapor deposited so that a layer having a thickness of 60 nm was formed and TPD78 was vapor deposited so that a layer having a thickness of 20 nm was formed on the layer of TPD106. Then, DPVDPAN, Alq and Ru11 were simultaneously vapor deposited on the formed layers in amounts such that the ratio of the amounts by weight of DPVDPAN, Alq and Ru11 was 20:20:2 and a layer of an organic light emitting medium having a thickness of 40 nm was formed. DPVDPAN was an anthracene derivative, Alq was an electron transporting compound and Ru11 was a condensed polycyclic aromatic compound.

Alq (an aluminum complex of 8-hydroxyquinoline) was vapor deposited so that a layer having a thickness of 20 nm was formed on the layer formed above. TPD106, TPD78, DPVDPAN:Alq:Ru11 and Alq were the hole injecting layer, the hole transporting layer, the layer of an organic light emitting medium and the electron injecting layer, respectively.

Then, LiF which was an alkali metal halide was vapor deposited so that a layer having a thickness of 0.3 nm was formed on the above layers and aluminum was vapor deposited so that a layer having a thickness of 100 nm was formed on the layer of LiF. The layers of LiF and Al worked as the cathode. An organic EL device was prepared as described above.

The device was tested by passing an electric current. Red light emission of 110 cd/m$^2$ was obtained at a voltage of 6

V and a current density of 3.0 mA/cm². The chromaticity coordinates were (0.61, 0.38) and the efficiency was 3.7 cd/A.

The device was tested by continuously passing direct current constantly at an initial luminance of 1,000 cd/m² and the half-life time was found to be as long as 2,600 hours.

EXAMPLES 2 TO 17

Organic EL devices were prepared in accordance with the same procedures as those conducted in Example 1 except that the layer of an organic light emitting medium was formed with compounds of component (A), compounds of component (B) and compounds of component (C) shown in Table 1 in amounts shown in Table 1. The properties of the obtained organic EL devices are shown in Table 1. In Table 1, Gaq represents tris(8-quinolinol)gallium.

TABLE 1-1

| | Organic light emitting medium layer | | | |
| --- | --- | --- | --- | --- |
| | component (A) | component (B) | component (C) | (A):(B):(C) (ratio by mass) |
| Example 1 | DPVDPAN | Alq | Ru11 | 20:20:1 |
| Example 2 | DPVDPAN | Alq | DC5 | 20:20:1 |
| Example 3 | EM1 | Alq | DC5 | 20:20:1 |
| Example 4 | EM3 | Alq | DC5 | 20:20:1 |
| Example 5 | EM13 | Alq | DC5 | 20:20:1 |
| Example 6 | EM23 | Alq | DC5 | 20:20:1 |
| Example 7 | EM11 | Alq | DC5 | 20:20:2 |
| Example 8 | EM1 | Alq | Rub6p | 20:20:2 |
| Example 9 | EM3 | Gaq | Rub6p | 20:20:2 |
| Example 10 | EM13 | Gaq | Rub6p | 20:20:2 |
| Example 11 | EM33 | Alq | Rub6p | 20:20:2 |
| Example 12 | EM35 | Gaq | Rub6p | 20:20:2 |
| Example 13 | EM1 | Alq | Ru11 | 20:20:1 |
| Example 14 | EM3 | Alq | Ru11 | 20:20:1 |
| Example 15 | EM13 | Alq | Ru11 | 20:20:1 |
| Example 16 | EM33 | Alq | Ru11 | 20:20:1 |
| Example 17 | EM35 | Gaq | Ru11 | 20:20:2 |
| Example 18 | DPVDPAN | Alq | rubrene | 20:20:2 |
| Comparative Example 1 | none | Alq | Ru11 | 0:40:1 |
| Comparative Example 2 | none | Alq | DC5 | 0:40:2 |
| Comparative Example 3 | none | Gaq | Rub6p | 0:40:2 |
| Comparative Example 4 | DPA | Alq | Ru11 | 20:20:1 |

TABLE 1-2

| | Voltage (V) | Current density (mA/cm²) | Luminance (cd/m²) | Efficiency (cd/A) | Half-life time (hour) |
| --- | --- | --- | --- | --- | --- |
| Example 1 | 6 | 3 | 110 | 3.7 | 2600 |
| Example 2 | 6 | 10.5 | 1050 | 10.0 | 4200 |
| Example 3 | 6 | 12 | 1050 | 8.8 | 3600 |
| Example 4 | 6 | 13 | 1180 | 9.1 | 3200 |
| Example 5 | 6 | 15.1 | 1400 | 9.3 | 3200 |
| Example 6 | 6 | 11.4 | 1150 | 10.1 | 2800 |
| Example 7 | 6 | 12 | 1300 | 10.8 | 3800 |
| Example 8 | 6 | 8.5 | 650 | 7.6 | 3600 |
| Example 9 | 6 | 7.4 | 500 | 6.8 | 2800 |
| Example 10 | 6 | 6.3 | 450 | 7.1 | 2500 |
| Example 11 | 6 | 7.6 | 550 | 7.2 | 3100 |
| Example 12 | 6 | 7.4 | 450 | 6.1 | 2500 |
| Example 13 | 6 | 3.2 | 100 | 3.1 | 2200 |
| Example 14 | 6 | 3 | 140 | 4.7 | 2500 |
| Example 15 | 6 | 3 | 104 | 3.5 | 2500 |
| Example 16 | 6 | 2.8 | 135 | 4.8 | 3600 |
| Example 17 | 6 | 2.7 | 100 | 3.7 | 1600 |

TABLE 1-2-continued

| | Voltage (V) | Current density (mA/cm²) | Luminance (cd/m²) | Efficiency (cd/A) | Half-life time (hour) |
| --- | --- | --- | --- | --- | --- |
| Example 18 | 6 | 6.7 | 350 | 5.2 | 2000 |
| Comparative Example 1 | 6 | 6.9 | 173 | 2.5 | 700 |
| Comparative Example 2 | 6 | 2.2 | 148 | 6.7 | 1800 |
| Comparative Example 3 | 6 | 12 | 650 | 5.4 | 1900 |
| Comparative Example 4 | 7.5 | 10.2 | 163 | 1.6 | short circuit at 250 |

EXAMPLE 18

A device was prepared in accordance with the same procedures as those conducted in Example 7 except that Alq:Cs/Al was used in place of LiF/Al. The layer of Alq:Cs was a layer of a mixture of Alq which was an electron transmitting compound and Cs metal which was a reducing dopant in amounts such that the ratio of the amounts by mole of Alq to Cs was 1:1. Yellow light emission of 203 cd/m² was obtained at a voltage of 4.5 V and a current density of 1.73 mA/cm². The efficiency was as high as 12.7 cd/A. When the device was driven under a constant current at an initial luminance of 1,000 cd/m², the half-life time was 3,500 hours.

COMPARATIVE EXAMPLE 1

An organic EL device was prepared in accordance with the same procedures as those conducted in Example 1 except that DPVDPAN was not used but Alq and Ru11 were simultaneously vacuum vapor deposited.

The properties of the obtained device were evaluated. A current of 6.9 mA/cm² was found under a voltage of 6 V. The luminance was 173 cd/m² and the efficiency was 2.5 cd/A. Therefore, the efficiency in Example 1 was 1.5 times as high as the efficiency in Comparative Example 1. When the device was driven under a constant current at an initial luminance of 1,000 cd/m², the half-life time was as short as 700 hours.

COMPARATIVE EXAMPLE 2

An organic EL device was prepared in accordance with the same procedures as those conducted in Example 2 except that DPVDPAN was not used but Alq and DC5 were simultaneously vacuum vapor deposited.

The properties of the obtained device were evaluated. A current of 2.2 mA/cm² was found under a voltage of 6 V. The luminance was 148 cd/m² and the efficiency was 6.7 cd/A. When the device was driven under a constant current at an initial luminance of 1,000 cd/m², the half-life time was as short as 1,800 hours. Therefore, the efficiency and the life time in Example 2 were more excellent than those in Comparative Example 2.

COMPARATIVE EXAMPLE 3

An organic EL device was prepared in accordance with the same procedures as those conducted in Example 12 except that EM35 was not used but Gaq and Rub6P were simultaneously vacuum vapor deposited.

The properties of the obtained device were evaluated. A current of 12 mA/cm² was found under a voltage of 6 V. The luminance was 650 cd/m² and the efficiency was 5.4 cd/A. Therefore, the efficiency in Example 1 was 1.5 times as high as the efficiency in Comparative Example 1. When the device was driven under a constant current at an initial luminance of 1,000 cd/m², the half-life time was as short as 1,900 hours. Therefore, the efficiency and the life time in Example 12 were more excellent than those in Comparative Example 3.

COMPARATIVE EXAMPLE 4

An organic EL device was prepared in accordance with the same procedures as those conducted in Example 1 except that DPVDPAN was not used and DPA, Alq and Ru11 were simultaneously vacuum vapor deposited. The properties of the obtained device were evaluated. A current of 2.7 mA/cm² was found under a voltage of 7 V. The luminance was 130 cd/m². The efficiency was as low as 2.2 cd/A. When the device was driven under a constant current at an initial luminance of 1,000 cd/m², short circuit occurred after 250 hours. Thus, no improvements were found in comparison with the organic EL obtained in Comparative Example 1. The properties were inferior to those in Example 1.

INDUSTRIAL APPLICABILITY

In accordance with the present invention, an organic EL device which exhibits excellent heat resistance, has a long life time and provides efficient light emission can be provided. The organic EL device can be advantageously used as the light emitting device in various types of display apparatuses.

What is claimed is:

1. An organic electroluminescence device which comprises a pair of electrodes, a hole injecting layer, a hole transporting layer, a layer of an organic light emitting medium, and an electron injecting layer disposed between the pair of electrodes, wherein the layer of an organic light emitting medium comprises (A) at least one electron transporting compound and (B) at least one compound selected from anthracene derivatives represented by general formula (I):

$$A^1\text{—}L\text{—}A^2 \quad (I)$$

wherein $A^1$ and $A^2$ each represent a substituted or unsubstituted monphenylanthryl group or a substituted or unsubstituted diphenylanthryl group and may represent a same group or different groups and L represents a single bond or a divalent connecting group; or anthracene derivatives represented by general formula (II):

$$A^3\text{—}An\text{—}A^4 \quad (II)$$

wherein An represents a substituted or unsubstituted divalent anthracene residue group and $A^3$ and $A^4$ each represent a substituted or unsubstituted monovalent condensed aromatic ring group having 10 or more carbon atoms or a substituted or unsubstituted non-condensed ring aryl group having 12 or more carbon atoms and may represent a same group or different groups.

2. An organic electroluminescence device according to claim 1, wherein the anthracene derivative represented by general formula (I) is an anthracene derivative represented by general formula (I-a):

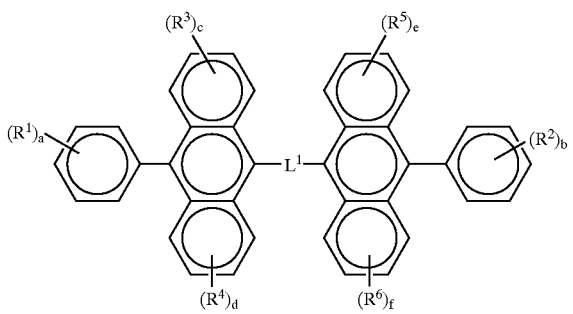

wherein $R^1$ to $R^6$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; a and b each represent an integer of 0 to 5; c, d, e and f each represent an integer of 0 to 4; when any of a to f represents an integer of 2 or greater, a plurality of groups represented by corresponding $R^1$, $R^2$, $R^3$, $R^4$, $R^5$ or $R^6$ may be the same with or different from each other and may form a ring by forming a bond between each other; and $L^1$ represents a single bond, —O—, —S—, —N(R)— or an arylene group, R representing an alkyl group or a substituted or unsubstituted aryl group; or an anthracene derivative represented by general formula (I-b):

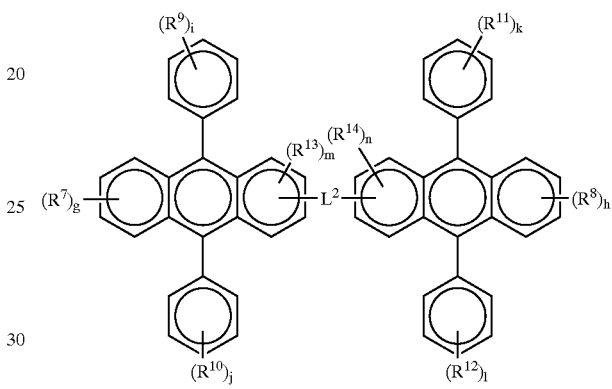

wherein $R^7$ to $R^{14}$ each independently represent an alkyl group, a cycloalkyl group, an alkenyl group, a substituted or unsubstituted aryl group, an alkoxy group, an aryloxy group, an alkylamino group, an arylamino group or a substituted or unsubstituted heterocyclic group; g and h each represent an integer of 0 to 4; i, j, k and l each represent an integer of 0 to 5; m and n each represent an integer of 0 to 3; when any of g to l represents an integer of 2 or greater, a plurality of groups represented by corresponding $R^7$, $R^8$, $R^9$, $R^{10}$, $R^{11}$ or may be the same with or different from each other and may form a ring by forming a bond between each other; and $L^2$ represents a single bond, —O—, —S—, —N(R)—or an arylene group, R representing an alkyl group or a substituted or unsubstituted aryl group.

3. An organic electroluminescence device according to claim 1, wherein the anthracene derivative represented by general formula (II) of component (B) is an anthracene derivative represented by general formula (II-a):

$$\text{Ar}^1\text{—}An\text{—}\text{Ar}^2 \quad (II\text{-}a)$$

wherein An represents a substituted or unsubstituted divalent anthracene residue group and $\text{Ar}^1$ and $\text{Ar}^2$ each independently represent a monovalent residue group derived from fluoranthene, naphthalene, phenanthrene, anthracene, pyrene, perylene, coronene, chrysene, picene, fluorene, terphenyl, diphenylanthracene, biphenyl, an N-alkylcarbazole, an N-arylcarbazole, triphenylene, rubicene, benzoanthracene or dibenzoanthracene, which may be substituted or unsubstituted, or a group represented by general formula (II-x):

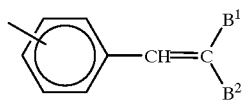

(II-x)

wherein B¹ and B² each represent a substituted or unsubstituted phenyl group, naphthyl group, biphenyl group, terphenyl group or anthryl group.

4. An organic electroluminescence device according to claim 1, wherein the electron transporting compound of component (A) is a metal complex comprising a ligand having a nitrogen atom, a heterocyclic compound having a nitrogen atom or a ring compound having Si.

5. An organic electroluminescence device according to claim 1, wherein the layer of an organic light emitting medium comprises component (A) and component (B) in amounts such that a ratio of an amount by mass of component (A) to an amount by mass of component (B) is in a range of 1:99 to 99:1.

6. An organic electroluminescence device according to claim 1, wherein the layer of an organic light emitting medium comprises a fluorescent compound as component (C).

7. An organic electroluminescence device according to claim 6, wherein the fluorescent compound of component (C) is a compound selected from styryl derivatives comprising amines which are represented by general formula (III):

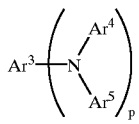

(III)

wherein $Ar^3$, $Ar^4$ and $Ar^5$ each independently represent a substituted or unsubstituted monovalent aromatic group having 6 to 40 carbon atoms, at least one of the groups represented by $Ar^3$, $Ar^4$ and $Ar^5$ comprises a substituted or unsubstituted styryl group and p represents an integer of 1 to 4; styryl derivatives comprising amines which are represented by general formula (IV):

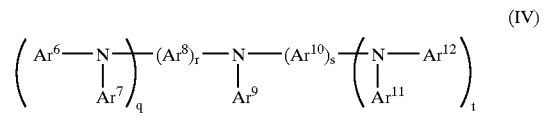

(IV)

wherein $Ar^6$, $Ar^7$, $Ar^9$, $Ar^{11}$ and $Ar^{12}$ each independently represent substituted or unsubstituted monovalent aromatic group having 6 to 40 carbon atoms, $Ar^8$ and $Ar^{10}$ each independently represent a substituted or unsubstituted divalent aromatic up having 6 to 40 carbon atoms, at least one of the groups represented by $Ar^6$ to $Ar^{12}$ comprises a substituted or unsubstituted styryl group or a substituted or unsubstituted styrylene group, q and t each represent an integer of 0 to 2 and r and s each represent an integer of 1 or 2; and condensed polycyclic aromatic compounds.

8. An organic electroluminescence device according to claim 6, wherein the layer of an organic light emitting medium comprises component (A), component (B) and component (C) in amounts such that a ratio of a total amount by mass of component (A) and component (B) to an amount by mass of component (C) is in a range of 100:1 to 1:10.

9. An organic electroluminescence device according to claim 1, which comprises a layer of a chalcogenide, a layer of a metal halide or a layer of a metal oxide, which is disposed on a surface of at least one of the pair of electrodes.

10. An organic electroluminescence device according to claim 1, which comprises a mixed region of a reducing dopant and an organic substance or a mixed region of an oxidizing dopant and an organic substance, which is disposed on a surface of at least one of the pair of electrodes.

11. An organic electroluminescence device according to claim 1, wherein the layer of an organic light emitting medium has a thickness in a range of 10 to 400 nm.

12. The organic electroluminescence device according to claim 1, wherein said hole injecting layer is TPD106

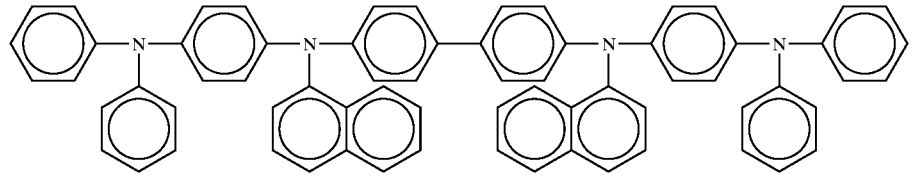

TPD 106 and the hole transporting layer is TPD78

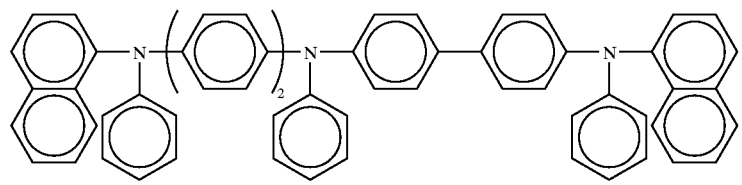

TPD 78

13. The organic electroluminescence device according to claim 12, wherein said electron injecting layer is an aluminum complex of 8-hydroxyquinoline.

\* \* \* \* \*